(12) United States Patent
Kondo

(10) Patent No.: US 10,885,969 B2
(45) Date of Patent: Jan. 5, 2021

(54) SEMICONDUCTOR DEVICE VERIFYING SIGNAL SUPPLIED FROM OUTSIDE

(71) Applicant: LONGITUDE LICENSING LIMITED, Dublin (IE)

(72) Inventor: Chikara Kondo, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 0 days.

(21) Appl. No.: 16/709,160

(22) Filed: Dec. 10, 2019

(65) Prior Publication Data

US 2020/0111519 A1 Apr. 9, 2020

Related U.S. Application Data

(63) Continuation of application No. 15/903,666, filed on Feb. 23, 2018, now abandoned, which is a (Continued)

(30) Foreign Application Priority Data

Sep. 28, 2011 (JP) .................. 2011-212143

(51) Int. Cl.
| | | |
|---|---|---|
| G11C 7/00 | (2006.01) | |
| G11C 11/409 | (2006.01) | |
| G11C 7/24 | (2006.01) | |
| G11C 11/4076 | (2006.01) | |
| G11C 11/4078 | (2006.01) | |
| G11C 11/408 | (2006.01) | |
| G11C 11/4063 | (2006.01) | |

(Continued)

(52) U.S. Cl.
CPC .............. *G11C 11/409* (2013.01); *G11C 7/24* (2013.01); *G11C 11/408* (2013.01); *G11C 11/4063* (2013.01); *G11C 11/4076* (2013.01); *G11C 11/4078* (2013.01); *G11C 29/52* (2013.01); *G11C 8/12* (2013.01)

(58) Field of Classification Search
CPC ...................................... G11C 11/409
USPC ....................................... 365/191
See application file for complete search history.

(56) References Cited

U.S. PATENT DOCUMENTS 8,767,502 B2 7/2014 Kondo
9,123,434 B2 9/2015 Kondo
(Continued)

FOREIGN PATENT DOCUMENTS

JP 2011081893 A 4/2011

*Primary Examiner* — Hoai V Ho
(74) *Attorney, Agent, or Firm* — Kunzler Bean & Adamson

(57) ABSTRACT

Disclosed herein is a semiconductor device that includes an access control circuit generating an internal command based on a verification result signal and an external command. The external command indicates at least one of a first command that enables the access control circuit to access a first circuit and a second command that enables the access control circuit not to access the first circuit or enables the access control circuit to maintain a current state of the first circuit. The access control circuit, when the verification result signal indicates a first logic level, generates the internal command based on the external command. The access control circuit, when the verification result signal indicates a second logic level, generates the internal command that corresponds to a second command even if the external command indicates a first command.

10 Claims, 21 Drawing Sheets

Related U.S. Application Data continuation of application No. 15/403,531, filed on Jan. 11, 2017, now abandoned, which is a continuation of application No. 14/836,315, filed on Aug. 26, 2015, now Pat. No. 9,576,641, which is a continuation of application No. 14/295,231, filed on Jun. 3, 2014, now Pat. No. 9,123,434, which is a continuation of application No. 13/618,834, filed on Sep. 14, 2012, now Pat. No. 8,767,502.

(51) Int. Cl.
*G11C 29/52* (2006.01)
*G11C 8/12* (2006.01)

(56) References Cited

U.S. PATENT DOCUMENTS

| | | |
|---|---|---|
| 9,576,641 B2 | 2/2017 | Kondo |
| 2002/0097613 A1 | 7/2002 | Raynham |
| 2007/0133312 A1 | 6/2007 | Roohparvar |
| 2008/0239838 A1 | 10/2008 | Chi et al. |
| 2011/0066798 A1 | 3/2011 | Kaiwa et al. |
| 2011/0138261 A1* | 6/2011 | Bains ............... G06F 11/1016 714/800 |
| 2011/0320867 A1 | 12/2011 | Chaudhuri et al. |

* cited by examiner

| CS | CMD | | | | ICMD3 |
|---|---|---|---|---|---|
| | ACT | RAS | CAS | WE | |
| 0 | X | X | X | X | DESEL |
| 1 | 0 | 0 | 0 | 0 | NOP |
| 1 | 1 | 0 | 0 | 0 | IACT |
| 1 | 0 | 1 | 0 | 1 | IPRE |
| 1 | 0 | 0 | 1 | 1 | IWR1 |
| 1 | 0 | 0 | 1 | 0 | IRD1 |
| 1 | 0 | 1 | 1 | 1 | MRS |

FIG.2

|  | | CALEN | |
|---|---|---|---|
|  | | L (CAL OFF) | H (CAL ON) |
| PEN | L (PARITY OFF) | ICS1 | CCS |
|  | H (PARITY ON) | PCS | PCS |

FIG.10

|  | | CALEN | |
|---|---|---|---|
|  | | L (CAL OFF) | H (CAL ON) |
| PEN | L (PARITY OFF) | ICS1 | CCS |
| | H (PARITY ON) | CCS | CCS |

FIG.18

SEMICONDUCTOR DEVICE VERIFYING SIGNAL SUPPLIED FROM OUTSIDE

CROSS-REFERENCE TO RELATED APPLICATIONS

The present application is a Continuation Application of U.S. patent application Ser. No. 15/903,666 filed on Feb. 23, 2018, which is a Continuation Application of U.S. patent application Ser. No. 15/403,531 filed on Jan. 11, 2017, which is a Continuation Application of U.S. patent application Ser. No. 14/836,315 filed on Aug. 26, 2015, now U.S. Pat. No. 9,576,641, issued on Feb. 21, 2017, which is a Continuation Application of U.S. patent application Ser. No. 14/295,231 filed on Jun. 3, 2014, now U.S. Pat. No. 9,123,434, issued on Sep. 1, 2015, which is a Continuation Application of U.S. patent application Ser. No. 13/618,834 filed on Sep. 14, 2012, now U.S. Pat. No. 8,767,502, issued on Jul. 1, 2014, which is based on and claims priority from Japanese Patent Application No. 2011-212143, filed on Sep. 28, 2011, all of which are incorporated herein by reference in their entirety.

BACKGROUND OF THE INVENTION

1. Field of the Invention

The present invention relates to a semiconductor device and an information processing system including the same, and more particularly to a semiconductor device that can verify whether a control signal supplied from outside, such as a command signal, has proper logic and an information processing system including the same.

2. Description of Related Art

Semiconductor memory devices typified by a dynamic random access memory (DRAM) receive an address signal and a command signal supplied from a controller, and access their memory cell array based on the signals. More specifically, an address signal supplied to a semiconductor memory device is latched into an address latch circuit, and memory cells to be accessed are identified based on the address signal. A command signal supplied to the semiconductor memory device is decoded by a command decoder, and an access type (whether the access is a read operation, a write operation, etc.) is identified based on the command signal (see Japanese Patent Application Laid-Open No. 2011-81893).

DDR4 (Double Data Rate 4) DRAMs have recently been proposed as DRAMs even faster than DDR3 (Double Data Rate 3) DRAMs. DDR4 DRAMs support a new function called "CA parity". The CA parity refers to the function of verifying whether an address signal and a command signal supplied from a controller have proper logic. Such a function can be used to detect inversion of logic of bits constituting the address signal and the command signal, i.e., a parity error occurring during transmission if any.

What processing to perform on the DRAM side in the event of a parity error is important in view of improving the reliability of semiconductor devices in practical use. DRAMs that can perform appropriate processing in the event of a parity error are demanded. Such a demand is not only on DDR4 DRAMs but also on semiconductor devices in general that can verify control signals supplied from outside.

SUMMARY

In one embodiment, there is provided a semiconductor device that includes: an access control circuit generating an internal command based on a verification result signal and an external command, the external command including a first bit and a plurality of second bits supplied from outside, the access control circuit including a verification circuit verifying the second bits of the external command to generate the verification result signal; and a first circuit operating based on the internal command supplied from the access control circuit. The external command indicates at least one of a first command that enables the access control circuit to access the first circuit and a second command that enables the access control circuit not to access the first circuit or enables the access control circuit to maintain a current state of the first circuit. The access control circuit, when the verification result signal indicates a first logic level, generates the internal command based on the external command. The access control circuit, when the verification result signal indicates a second logic level, generates the internal command that corresponds to the second command even if the external command indicates the first command.

In another embodiment, there is provided a semiconductor device that includes: a memory cell array that includes a plurality of memory cells; and an access control circuit that receives an address signal indicating an address of at least one of the memory cells to be accessed and a command signal indicating an access type, and accessing the memory cell array based on the address signal and the command signal. The access control circuit includes a verification circuit that verifies the address signal and the command signal based on a verification signal supplied from outside. The verification circuit stops accessing the memory cell array indicated by the command signal when the address signal or the command signal is determined to be erroneous.

In still another embodiment, there is provided an information processing system that includes: a semiconductor device that includes a memory cell array including a plurality of memory cells; and a controller that controls the semiconductor device. The controller includes an output circuit that supplies an address signal indicating an address of at least one of a memory cells to be accessed, a command signal indicating an access type, and a verification signal generated based on the address signal and the command signal to the semiconductor device. The semiconductor device includes an access control circuit that accessing the memory cell array based on the address signal and the command signal. The access control circuit includes a verification circuit that verifies the address signal and the command signal based on the verification signal. The verification circuit stops accessing the memory cell array indicated by the command signal when the address signal or the command signal is determined to be erroneous.

In still another embodiment, there is provided a semiconductor device that includes: a verification circuit configured to receive a command signal, an address signal and a parity signal and output an error signal when detecting that at least one of the command signal and the address signal includes an error; and a parity latency circuit including a first latch chain receiving a chip select signal, a second latch chain receiving the command signal, a third latch chain receiving the address signal, and a fourth latch chain receiving the parity signal, the parity latency circuit further including a logic gate inserted in the first latch chain and receiving the error signal.

According to the present invention, access to internal circuits such as the memory cell array is stopped when a so-called parity error or other defect is detected. This avoid data destruction due to execution of an erroneous command, and overwriting of data to an erroneous address. The reliability of the semiconductor device in practical use can thus be improved.

BRIEF DESCRIPTION OF THE DRAWINGS

FIG. 2 is an example of a truth table for explaining an operation of a command decoder shown in FIG. 1;

FIG. 10 is a truth table for explaining the operation of a selector shown in FIG. 7;

FIG. 18 is a truth table for explaining the operation of a selector shown in FIG. 16;

DETAILED DESCRIPTION OF THE EMBODIMENT

A representative example of the technical concept of an embodiment of the present invention for solving the problem will be described below. It will be understood that what the present invention claims are not limited to such a technical concept but set forth in the claims of the present invention. More specifically, the technical concept of the present embodiment includes verifying an address signal and a command signal based on a verification signal, and stopping an access to the memory cell array, indicated by the command signal, if the address signal or the command signal is determined to be erroneous. As employed herein, the stopping refers to converting an access type indicated by the command signal into a different access type. Examples of the different access type include a DESEL command and a NOP command. Methods for stopping an access include forcefully deactivating a chip select signal to disable the access itself (corresponding to a DESEL command) and forcefully converting the content of the command into a NOP (no operation) command. This prevents the subsequent circuits from malfunctioning (if a subsequent circuit is a memory cell, from data destruction or from overwriting data to an erroneous address) due to the execution of an erroneous command even if a parity error or other defect is detected.

Figure 1:
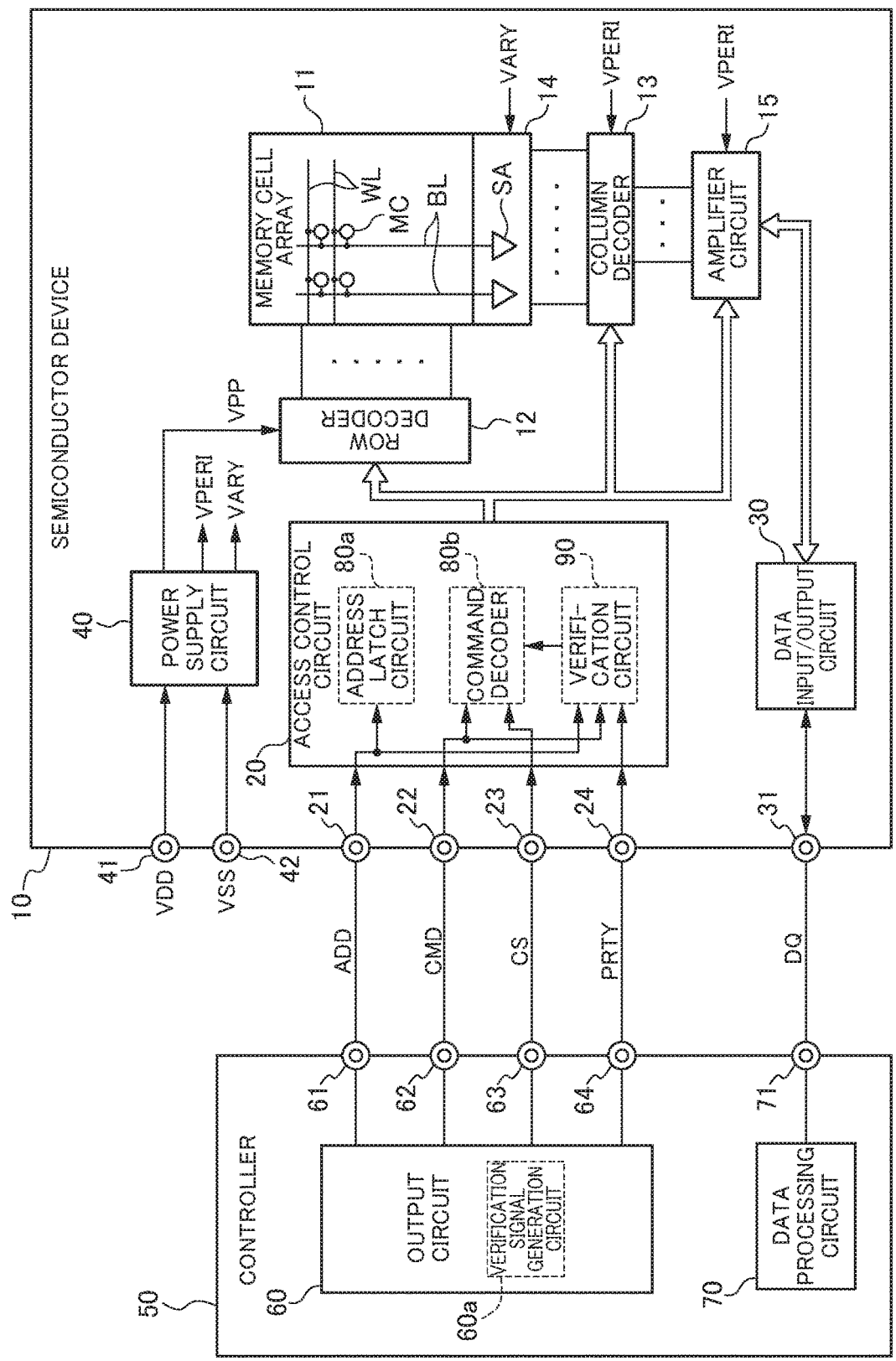
FIG. 1 is a block diagram for explaining the principle of an embodiment.

Referring now to FIG. 1, an information processing system including a controller 50 and a semiconductor device 10 is shown. The semiconductor device 10 shown in FIG. 1 is a semiconductor memory device such as a DRAM. The semiconductor device 10 includes a memory cell array 11. The memory cell array 11 includes a plurality of word lines WL and a plurality of bit lines BL which intersect each other. Memory cells MC are arranged at the intersections. The word lines WL are selected by a row decoder 12. The bit lines BL are selected by a column decoder 13. The bit lines BL are connected to respective corresponding sense amplifiers SA in a sense circuit 14. Bit lines BL selected by the column decoder 13 are connected to an amplifier circuit 15 through sense amplifiers SA.

The operation of the row decoder 12, the column decoder 13, the sense circuit 14, and the amplifier circuit 15 is controlled by an access control circuit 20. An address signal ADD, a command signal CMD, a chip select signal CS, and a verification signal PRTY are supplied to the access control circuit 20 through terminals 21 to 24. Based on such signals, the access control circuit 20 controls the row decoder 12, the column decoder 13, the sense circuit 14, the amplifier circuit 15, and a data input/output circuit 30. In the present embodiment, the circuit blocks that are controlled by the access control circuit 20, for example, the memory cell array 11, the row decoder 12, the column decoder 13, the sense circuit 14, the amplifier circuit 15, the data input/output circuit 30, and the like, may be referred to as a "first circuit". Further, a bit used as the chip select signal CS may be referred to as a "first bit", and a plurality of bits that constitute the command signal CMD may be referred to as "second bits" in the present embodiment.

Specifically, if the command signal CMD is an active command, the address signal ADD is supplied to the row decoder 12. In response to this, the row decoder 12 selects a word line WL that is designated by the address signal ADD, whereby corresponding memory cells MC are connected to respective bit lines BL. The access control circuit 20 then activates the sense circuit 14 at predetermined timing.

On the other hand, if the command signal CMD is a read command or a write command, the address signal ADD is supplied to the column decoder 13. In response to this, the column decoder 13 connects bit lines BL designated by the address signal ADD to the amplifier circuit 15. Consequently, in a read operation, read data DQ read from the memory cell array 11 through sense amplifiers SA is output from a data terminal 31 to outside through the amplifier circuit 15 and the data input/output circuit 30. In a write operation, write data DQ supplied from outside through the data terminal 31 and the data input/output circuit 30 is written to memory cells MC through the amplifier circuit 15 and sense amplifiers SA.

As shown in FIG. 1, the access control circuit 20 includes an address latch circuit 80a, a command decoder 80b, and a verification circuit 90.

The address latch circuit 80a is a circuit that latches the address signal ADD supplied through the address terminal 21. As described above, the address signal ADD latched in the address latch circuit 80a is supplied to the row decoder 21 or the column decoder 13 depending on the content of the command signal CMD.

The command decoder 80b is a circuit that decodes the command signal CMD supplied through the command terminal 22. The command signal CMD includes, though not limited to, a plurality of bits of control signals including an active signal ACT, a row address strobe signal RAS, a column address strobe signal CAS, and a write enable signal WE. Access types are defined by the combinations of the logic levels of such signals. Examples of the access types include a row access based on an active command, a read access based on a read command, a write access based on a write command, and a status quo operation based on a NOP command.

Turning to FIG. 2, in this example, combinations of the chip select signal CS and the command signal CMD produce internal commands including a DESEL command, the NOP command, an active command IACT, a precharge command IPRE, a write command IWR1, a read command IRD1, and a mode register setting command MRS.

The DESEL command is a command that is generated when the chip select signal CS is in an inactive state. When the DESEL command is issued, the access control circuit 20 performs no access operation. The NOP command is a command that is generated when the chip select signal CS is in an active state and all the bits of the command signal CMD are at a low level. Again, when the NOP command is issued, the access control circuit 20 performs no access operation.

When the active command IACT, the write command IWR1, and the read command IRD1 are issued, the access control circuit 20 performs the foregoing operations to make a row access, a write access, and a read access, respectively. The precharge command IPRE is a command for deactivating the memory cell array 11 which has been activated by the active command IACT. The mode register setting signal MRS is an internal command for rewriting a set value of the mode register described later.

The address latch circuit 80a and the command decoder 80b are activated based on the chip select signal CS supplied through the chip select terminal 23. If the chip select signal CS is in an inactive state, the address latch circuit 80a and the command decoder 80b are also deactivated. In such a case, the input address signal ADD and command signal CMD are disabled. In the present embodiment, the inactive state of the chip select signal CS may also be considered as a kind of command and referred to as a DESEL command. When a DESEL command is issued, the access control circuit 20 performs no access operation. This provides the same result as when a NOP command is issued.

The verification circuit 90 is a circuit that verifies the address signal ADD and the command signal CMD based on the verification signal PRTY supplied through the verification terminal 24. The verification method is not limited in particular. Preferred examples include a method of determining whether the number of high-level (or low-level) bits included in a plurality of bits constituting the address signal ADD and the command signal CMD is an even number or an odd number, and collating the determination with the verification signal PRTY. In such a case, the verification signal PRTY corresponds to a so-called parity bit, which may consist of only one bit.

The foregoing circuit blocks operate with respective predetermined internal voltages as their power supply. The internal power supplies are generated by a power supply circuit 40 shown in FIG. 1. The power supply circuit 40 receives an external potential VDD and a ground potential VSS supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD.

The internal voltage VPP is a voltage that is mainly used in the row decoder 12. The row decoder 12 drives a word line WL that is selected based on the address signal ADD to the VPP level, thereby making the cell transistors included in memory cells MC conducting. The internal voltage VARY is a voltage that is mainly used in the sense circuit 14. The sense circuit 14, when activated, drives either one of each pair of bit lines to the VARY level and the other to the VSS level, thereby amplifying read data that is read out. The internal voltage VPERI is used as the operating voltage of most of the peripheral circuits such as the access control circuit 20. The use of the internal voltage VPERI lower than the external voltage VDD as the operating voltage of the peripheral circuits reduces the power consumption of the semiconductor device 10.

Now, the controller 50 includes an output circuit 60 and a data processing circuit 70. The output circuit 60 is a circuit for supplying the address signal ADD, the command signal CMD, the chip select signal CS, and the verification signal PRTY to the semiconductor device 10 through terminals 61 to 64. The data processing circuit 70 is a circuit that processes read data DQ and write data DQ input/output through a data terminal 71.

When accessing the semiconductor device 10, the controller 50 activates the chip select signal CS and supplies the address signal ADD and the command signal CMD. The controller 50 also supplies the verification signal PRTY that is generated based on the address signal ADD and the command signal CMD. The verification signal PRTY is generated by a verification signal generation circuit 60a. Suppose that the verification signal PRTY is a parity bit. If the number of high-level bits included in the plurality of bits constituting the address signal ADD and the command signal CMD is an even number, the verification signal generation circuit 60a sets the verification signal PRTY to a low level. If the number of high-level bits is an odd number, the verification signal generation circuit 60a sets the verification signal PRTY to a high level. In other words, the plurality of bits constituting the address signal ADD, the command signal CMD, and the verification signal PRTY always include an even number of high-level bits. The timing for the controller 50 to supply the chip select signal CS, the address signal ADD, the command signal CMD, and the verification signal PRTY to the semiconductor 10 is not limited in particular. All the signals may be simultaneously supplied. The chip select signal CS may be issued alone in advance, followed by the issuance of the adders signal ADD, the command signal CMD, and the verification signal PRTY after a lapse of predetermined time.

Each time the controller 50 accesses the semiconductor device 10, the verification circuit 90 included in the semiconductor device 10 verifies the address signal ADD and the command signal CMD. If the verification result shows that the address signal ADD and the command signal CMD include no defect, the verification circuit 90 allows the command decoder 80b to perform a decoding operation on the command signal CMD. Consequently, an access operation selected by the command signal CMD is performed. In the present embodiment, a command for making an effective access to the memory cell array 11 may be referred to as a "first command".

On the other hand, if the verification result shows that the address signal ADD or the command signal CMD include a defect, the verification circuit 90 controls the command decoder 80b so that the command decoder 80b performs the same operation as in the case where a DESEL command or a NOP command is issued. In the present embodiment, a command for making no access to the memory cell array 11 or maintaining the state of the memory cell array 11 may be referred to as a "second command".

The case where a DESEL command is issued refers to that the chip select signal CS is in an inactive state. To make the command decoder 80b perform the same operation as in the case where a DESEL command is issued, the chip select signal CS supplied from outside may be forcefully converted inside from an active state into an inactive state. The case where a NOP command is issued refers to that the chip select signal CS is in an active state and a combination of command signals CMD indicates a NOP command. To make the command decoder 80b perform the same operation as in the case where a NOP command is issued, the combination of command signals CMD supplied from outside may be forcefully converted inside that of a NOP command.

For example, suppose a bit is inverted during transmission of the address signal ADD and the command signal CMD from the controller 50 to the semiconductor device 10. In such a case, the verification circuit 90 detects the error, and the command is converted into a DESEL command or a NOP command. Since no effective access to the memory cell array 11 is made, the problem of executing an erroneous command or overwriting the memory cell array 11 with erroneous data is avoided.

Preferred embodiments of the present invention will be explained below in detail with reference to the accompanying drawings.

Figure 3:
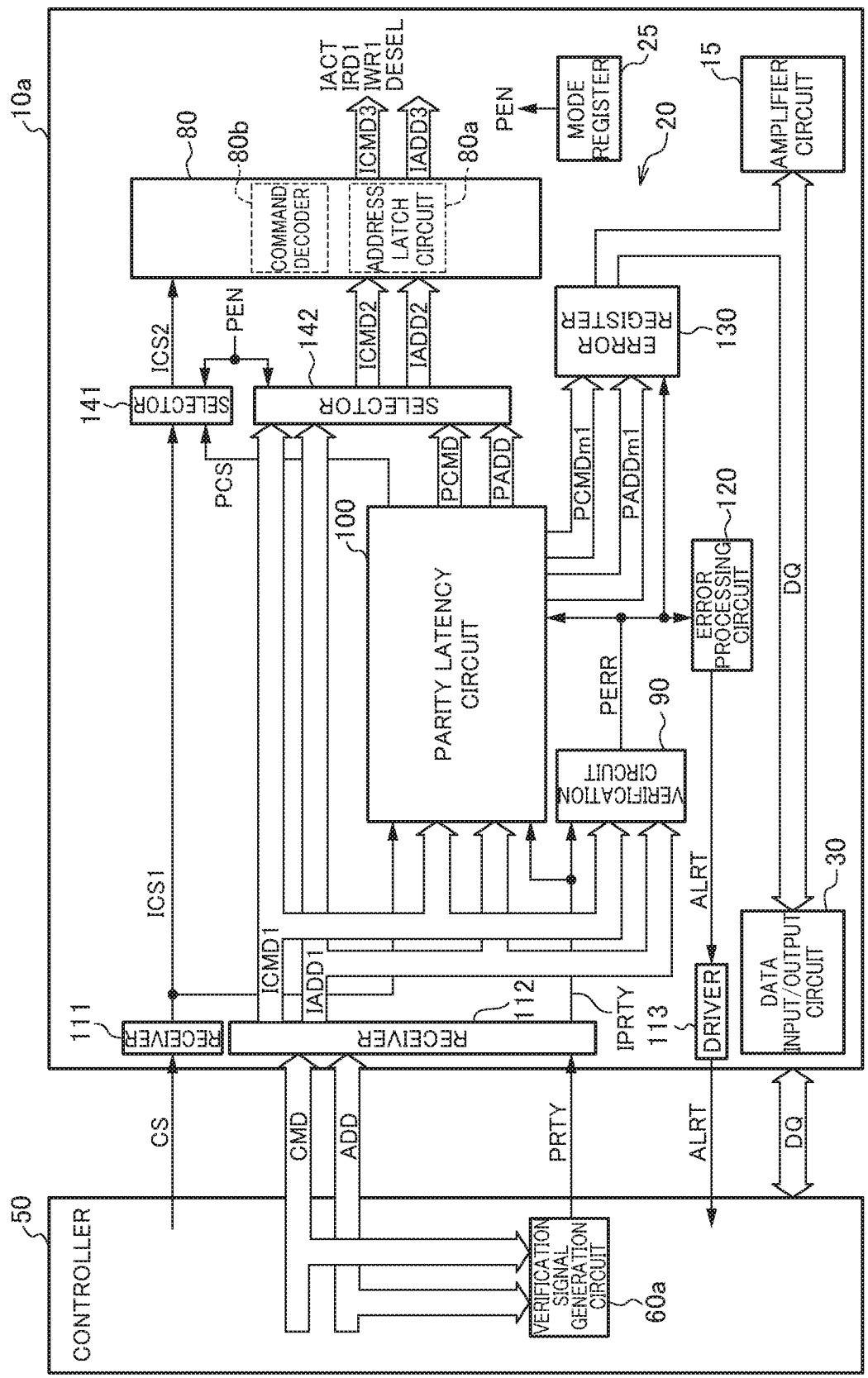
FIG. 3 is a block diagram indicative of an embodiment of a semiconductor device 10a according to a preferred first embodiment of the present invention and mainly shows details of circuit blocks belonging to an access control circuit shown in FIG. 1.

Turning to FIG. 3, the access control circuit 20 includes receivers 111 and 112. The receiver 111 receives the chip select signal CS supplied from the controller 50 and generates an internal chip select signal ICS1. The receiver 112 receives the address signal ADD, the command signal CMD, and the verification signal PRTY supplied from the controller 50 and generates an internal address signal IADD1, an internal command signal ICMD1, and an internal verification signal IPRTY. The internal address signal IADD1, the internal command signal ICMD1, and the internal verification signal IPRTY are all supplied to the verification circuit 90.

In the present embodiment, the verification signal PRTY is a parity bit which indicates whether the number of high-level bits among the plurality of bits constituting the address signal ADD and the command signal CMD is an even number or an odd number. Specifically, if the number of high-level bits among the plurality of bits constituting the address signal ADD and the command signal CMD is an even number, the verification signal PRTY becomes a low level. If the number of high-level bits is an odd number, the verification signal PRTY becomes a high level. Therefore, the plurality of bits including the address signal ADD, the command signal CMD, and the verification signal PRTY must always include an even number of high-level bits. If the number of high-level bits is an odd number, it means that either the address signal ADD or the command signal CMD is erroneous.

Figure 4:
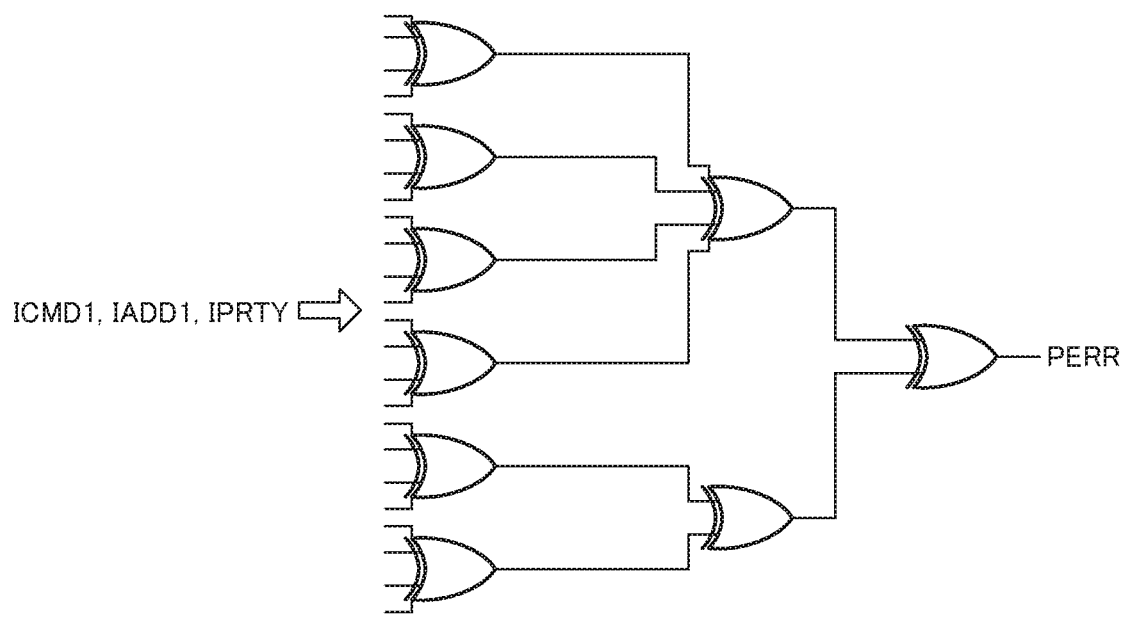
FIG. 4 is a circuit diagram for explaining the function of a verification circuit shown in FIG. 3.

Turning to FIG. 4, the verification circuit 90 calculates exclusive ORs of the plurality of bits constituting the address signal ADD and the command signal CMD and the bit constituting the verification signal PRTY by two bits. The verification circuit 90 further calculates exclusive ORs of the resultants to finally obtain a 1-bit calculation result. An exclusive OR operation produces a low level if two input bits coincide with each other (i.e., if the number of high-level bits is an even number), and a high level if the two input bits do not coincide with each other (i.e., if the number of high-level bits is an odd number). If the final result bit is at a low level, it shows that the number of high-level bits in the plurality of input bits is an even number. On the other hand, if the final result bit is at a high level, it shows that the number of high-level bits in the plurality of input bits is an odd number. The bit finally resulting from the verification circuit 90 constitutes a parity error signal PERR. The parity error signal PERR of high level indicates the occurrence of an error. In the present embodiment, the parity error signal PERR may be referred to as a "verification result signal". The parity error signal PERR is supplied to a parity latency circuit 100, an error processing circuit 120, an error register 130, and the like shown in FIG. 3.

The parity latency circuit 100 retains the internal chip select signal ICS1, the internal address signal IADD1, and the internal command signal ICMD1 as long as needed for the verification circuit 90 to perform a parity check (i.e., as long as a verification period, or parity latency). After a lapse of the parity latency, the parity latency circuit 100 outputs the retained signals as an internal chip select signal PCS, an internal address signal PADD, and an internal command signal PCMD, respectively. In the present embodiment, the parity latency circuit 100 may be referred to as a "second circuit". The node of the parity latency circuit 100 for inputting the internal chip select signal ICS1 may be referred to as a "third input node". The node of the parity latency circuit 100 for inputting the internal command signal ICMD1 may be referred to as a "fourth input node".

The error processing circuit 120 is a circuit that performs error processing when the parity error signal PERR is activated to a high level. The content of the error processing is not limited in particular. Examples include processing for forcefully deactivating the memory cell array 11. The memory cell array 11 may be deactivated by restoring the memory cell array in which a word line WL is selected by an active command to a precharge state, i.e., restoring all the word lines WL to an inactive state. If the memory cell array 11 is divided into a plurality of banks, all the banks are preferably put into an inactive state. Deactivating the memory cell array 11 in the presence of a parity error prevents the data retained in the memory cell array 11 from being damaged by an erroneous command or an erroneous address.

In the present embodiment, when the parity error signal PERR is activated, the error processing circuit 120 generates an alert signal ALRT. The alert signal ALRT is output to outside through a driver 113. The alert signal ALRT output outside is supplied to the controller 50, whereby the controller 50 is informed of the occurrence of the parity error.

The error register 130 is a circuit that retains the address signal ADD and the command signal CMD pertaining to the parity error when the parity error signal PERR is activated to a high level. In fact, the error register 130 retains an internal address signal PADDm1 and an internal command signal PCMDm1 which are intermediate products of the delaying by the parity latency circuit 100. The internal address signal PADDm1 and the internal command signal PCMDm1 retained in the error register 130 are output to outside through the data input/output circuit 30. The internal address signal PADDm1 and the internal command signal PCMDm1 output outside are supplied to the controller 50, whereby the controller 50 is informed of which address signal ADD or command signal CMD has caused the parity error.

Figure 5:
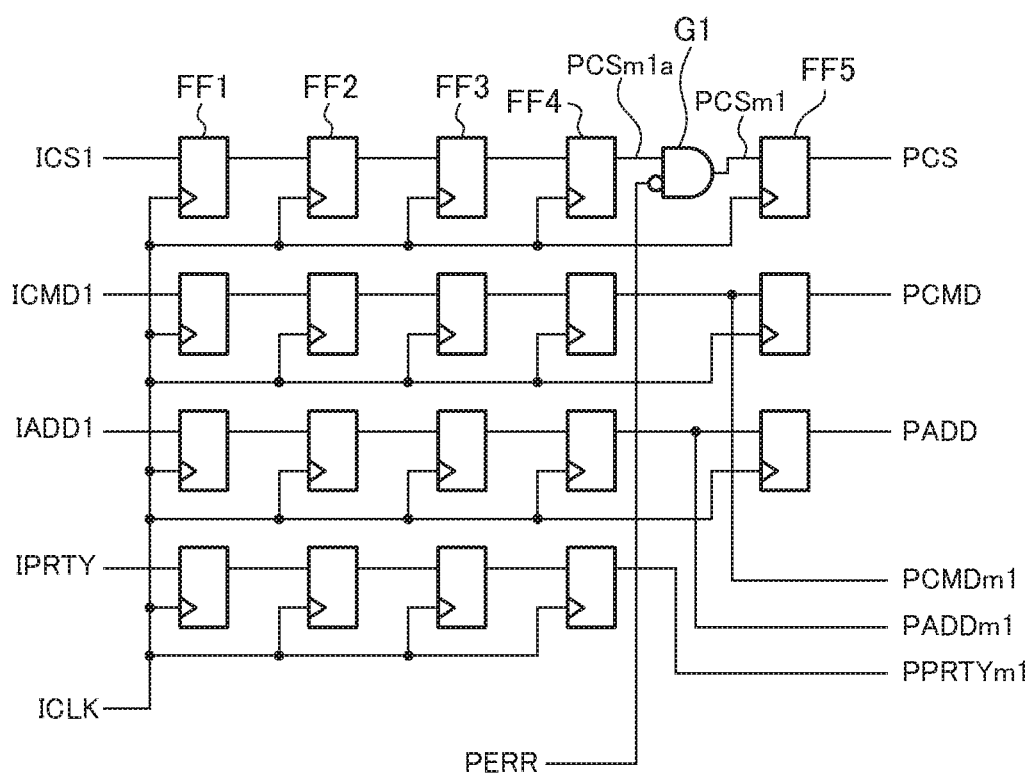
FIG. 5 is a circuit diagram indicative of an embodiment of a parity latency circuit shown in FIG. 3.

Turning to FIG. 5, the parity latency circuit 100 has a latency of five clock cycles. The latency need not be fixed and may be variable depending on a mode setting. The mode setting is performed by setting a predetermined mode signal into a mode register 25 shown in FIG. 3. Set values of the mode register 25 include a set value about whether to enable or disable a parity check on the address signal ADD and the command signal CMD. If an operation mode for enabling the parity check (parity ON mode) is set, a mode signal PEN is activated to a high level, for example. If an operation mode for disabling the parity check (parity OFF mode) is set, the mode signal PEN is deactivated to a low level, for example.

The parity latency circuit 100 uses an internal clock signal ICLK, which is generated based on an external clock signal supplied from the controller 50. In the present example, five stages of shift registers are provided on the path that receives the internal chip select signal ICS1 and outputs the internal chip select signal PCS. The internal chip select signal PCS is thus output five clock cycles after the reception of the internal chip select signal ICS1. The same holds for the internal command signal ICMD1 and the internal address signal IADD1, which are output through five stages of shift registers as the internal command signal PCMD and the internal address signal PADD, respectively.

In the parity latency circuit 100 shown in FIG. 5, the path for counting the internal chip select signal ICS1 includes an AND gate circuit G1. The AND gate circuit G1 is inserted between the output node of the flip-flop circuit FF4 at the fourth stage and the input node of the flip-flop circuit FF5 at the fifth stage. If the parity error signal PERR is at a low level, the AND gate circuit G1 simply supplies a signal PCSm1a output from the flip-flop circuit FF4 at the fourth stage to the flip-flop circuit FF5 at the fifth stage. On the other hand, if the parity error signal PERR is at a high level, the AND gate circuit G1 forcefully deactivates its signal PCSm1, which is supplied to the flip-flop circuit FF5 at the fifth stage, to a low level regardless of the signal PCSm1 output from the flip-flop circuit FF4 at the fourth stage.

In the present example, the parity check by the verification circuit 90 needs to be completed before the flip-flop circuit FF5 at the fifth stage latches the signal PCSm1. If the parity check by the verification circuit 90 shows the absence of a parity error, the internal chip select signal PCS is properly output at the fifth clock cycle. On the other hand, if the parity check by the verification circuit 90 shows the occurrence of a parity error, the internal chip select signal PCS output at the fifth clock cycle is forcefully deactivated to a low level. In other words, the corresponding command is converted into a DESEL command.

Meanwhile, the internal command signal ICMD1 and the internal address signal IADD1 are output as the internal command signal PCMD and the internal address signal PADD at the fifth clock cycle regardless of the result of the parity check. Note that the signals PCMDm1 and PADDm1 output from the flip-flop circuits FF4 at the fourth stages are supplied to the foregoing error register 130. The same holds for an internal verification signal PPRTYm1 which is synchronous with the signals PCMDm1 and PADDm1.

The internal chip select signal PCS output from the parity latency circuit 100 is input to one of the input nodes of a selector 141 shown in FIG. 3. The internal chip select signal ICS1 not passed through the parity latency circuit 100 is supplied to the other input node of the selector 141. In the present embodiment, the selector 141 may be referred to as a "third circuit".

The selector 141 outputs either one of the signals PCS and ICS1 as an internal chip select signal ICS2 based on the mode signal PEN. Specifically, if the mode signal PEN is activated to a high level (set to the parity ON mode), the internal chip select signal PCS is selected. If the mode signal PEN is deactivated to a low level (set to the parity OFF mode), the internal chip select signal ICS1 is selected. The internal chip select signal ICS2 output as the result of selection is supplied to a first input node of a circuit block 80. The circuit block 80 is a circuit block that includes the address latch circuit 80a and the command decoder 80b shown in FIG. 1. The circuit block 80 is activated based on the internal chip select signal ICS2.

Similarly, the internal command signal PCMD and the internal address signal PADD output from the parity latency circuit 100 are input to one of the input nodes of a selector 142. The internal command signal ICMD1 and the internal address signal IADD1 not passed through the parity latency circuit 100 are supplied to other input node of the selector 142. In the present embodiment, the selector 142 may be referred to as a "fourth circuit".

The selector 142 outputs either pair of the signals as an internal command signal ICMD2 and an internal address signal IADD2 based on the mode signal PEN. Specifically, if the mode signal PEN is activated to a high level (set to the parity ON mode), the internal command signal PCMD and the internal address signal PADD are selected. If the mode signal PEN is deactivated to a low level (set to the parity OFF mode), the internal command signal ICMD1 and the internal address signal IADD1 are selected. The internal command signal ICMD2 and the internal address signal IADD2 output as the result of selection are supplied to a second input node of the circuit block 80. Consequently, the internal address signal IADD2 is latched into the address latch circuit 80*a*, and the internal command signal ICMD2 is decoded by the command decoder 80*b*. The internal address signal IADD2 latched into the address latch circuit 80*a* is output as an internal address signal IADD3, which is supplied to the row decoder 12 and the column decoder 13 shown in FIG. 1. The command decoder 80*b* decodes the internal command signal ICMD2 to generate an internal command signal ICMD3. Circuit blocks such as the row decoder 12 and the column decoder 13 are controlled by the internal command signal ICMD3.

The internal command signal ICMD3 includes a plurality of signals for making an effective access to the memory cell array, such as an active signal IACT for making a row access, a read signal IRD1 for performing a read operation, and a write signal IWR1 for performing a write operation. Any one of the signals is activated according to the internal command signal ICMD2. The internal command signal ICMD3 further includes an internal command DESEL for making no access to the memory cell array. When the internal chip select signal ICS2 is deactivated, the internal command DESEL is activated regardless of the internal command signal ICMD2.

The essential circuit configuration of the semiconductor device 10*a* according to the present embodiment has been described so far. Next, the operation of the semiconductor device 10*a* according to the present embodiment will be described.

Figures 6A, 6B:
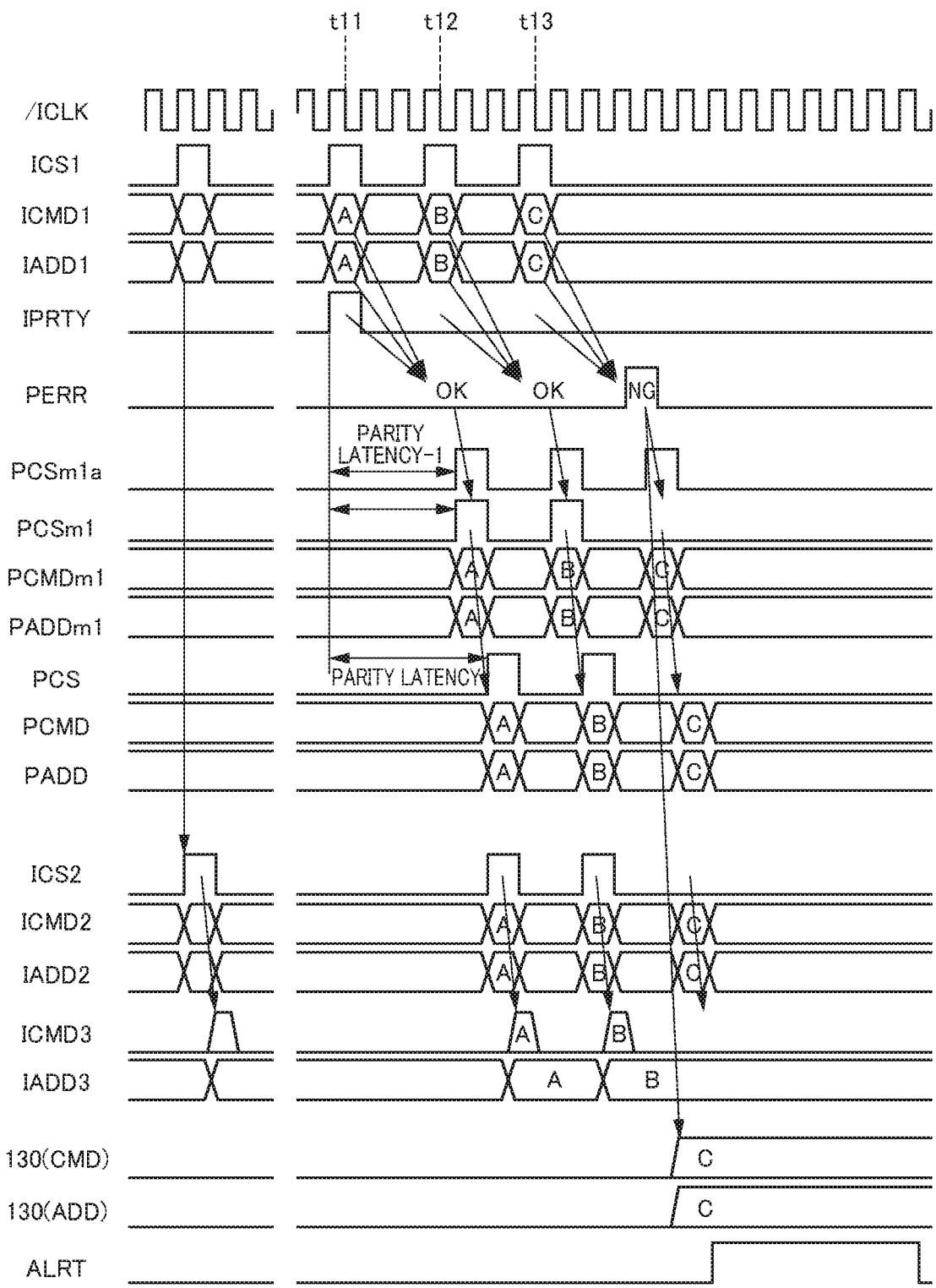
FIG. 6A is a timing chart for explaining the operation of the semiconductor device shown in FIG. 3 in the parity OFF mode.
FIG. 6B is a timing chart for explaining the operation of the semiconductor device shown in FIG. 3 in the parity ON mode.

FIGS. 6A and 6B are timing charts for explaining the operation of the semiconductor device shown in FIG. 3. In FIGS. 6A and 6B, a /ICLK represents an inverted signal of an internal clock signal ICLK.

Referring to FIG. 6A, in the parity OFF mode, the mode signal PEN is deactivated to a low level. The selector 141 therefore selects the internal chip select signal ICS1. The selector 142 selects the internal command signal ICMD1 and the internal address signal IADD1. As shown FIG. 6A, the internal chip select signal ICS1, the internal command signal ICMD1, and the internal address signal IADD1 are simply supplied to the circuit block 80 as the internal chip select signal ICS2, the internal command signal ICMD2, and the internal address signal IADD2. The circuit block 80 performs a decoding operation of the internal command signal ICMD2 and a latch operation of the internal address signal IADD2. Consequently, the internal command signal ICMD3 and the internal address signal IADD3 are output without a wait for the parity latency, and an operation based on the signals is immediately performed.

Turning to FIG. 6B, in the parity ON mode, the mode signal PEN is activated to a high level. The selector 141 therefore selects the internal chip select signal PCS. The selector 142 selects the internal command signal PCMD and the internal address signal PADD. In the example shown in FIG. 6B, the internal chip select signal ICS1, the internal command signal ICMD1, and the internal address signal IADD1 occur at times t11, t12, and t13.

Suppose that the internal command signal ICMD1 and the internal address signal IADD1 occurring at time t11 include an odd number of high-level bits and an even number of high-level bits, respectively. The total number of high-level bits is an odd number. Since the corresponding internal verification signal IPRTY is correctly at a high level, the verification circuit 90 deactivates the parity error signal PERR to a low level. The level of the parity error signal PERR is settled at the timing the fourth clock cycle (parity latency—1) from time t11. After a lapse of five clock cycles since time t11, the parity latency circuit 100 outputs the internal chip select signal PCS, the internal command signal PCMD, and the internal address signal PADD. Consequently, the internal command signal ICMD3 and the internal address signal IADD3 are output, and an operation based on the signals is performed.

The internal command signal ICMD1 and the internal address signal IADD1 occurring at time t12 include an even number of high-level bits each. The total number of high-level bits is also an even number. Since the corresponding internal verification signal IPRTY is correctly at a low level, the verification circuit 90 deactivates the parity error signal PERR to a low level. The level of the parity error signal PERR is settled at the timing the fourth clock cycle (parity latency—1) from time t12. After a lapse of five clock cycles since time t12, the parity latency circuit 100 outputs the internal chip select signal PCS, the internal command signal PCMD, and the internal address signal PADD. Consequently, the internal command signal ICMD3 and the internal address signal IADD3 are output, and an operation based on the signals is performed.

Now, the internal command signal ICMD1 and the internal address signal IADD1 occurring at time t13 include an odd number of high-level bits and an even number of high-level bits, respectively. The total number of high-level bits is an odd number. In the present example, the internal verification signal IPRTY is at a low level whereas the internal verification signal IPRTY is supposed to be at a high level. The verification circuit 90 therefore activates the parity error signal PERR to a high level. The level of the parity error signal PERR is settled at the timing the fourth clock cycle (parity latency—1) from time t13. After a lapse of five clock cycles since time t13, the parity latency circuit 100 outputs the internal command signal PCMD and the internal address signal PADD. The internal chip select signal PCS is deactivated to a low level. In other words, the semiconductor device 10*a* enters the same state as when a DESEL command is issued. Consequently, the address latch circuit 80*a* and the command decoder 80*b* make no operation, nor is the memory cell array 11 accessed. This means that if the access A started at time t11 and the access B started at time t12 are still in process, the accesses A and B will not be stopped or changed. The accesses A and B are therefore normally executed.

The internal command signal ICMD1 and the internal address signal IADD1 occurring at time t13 are taken into the error register 130. In addition, the error processing circuit 120 generates the alert signal ALRT. The controller 50 is thus informed of the occurrence of the parity error and which command signal CMD or address signal ADD has caused the error.

Next, a second embodiment of the present invention will be described.

Figure 7:
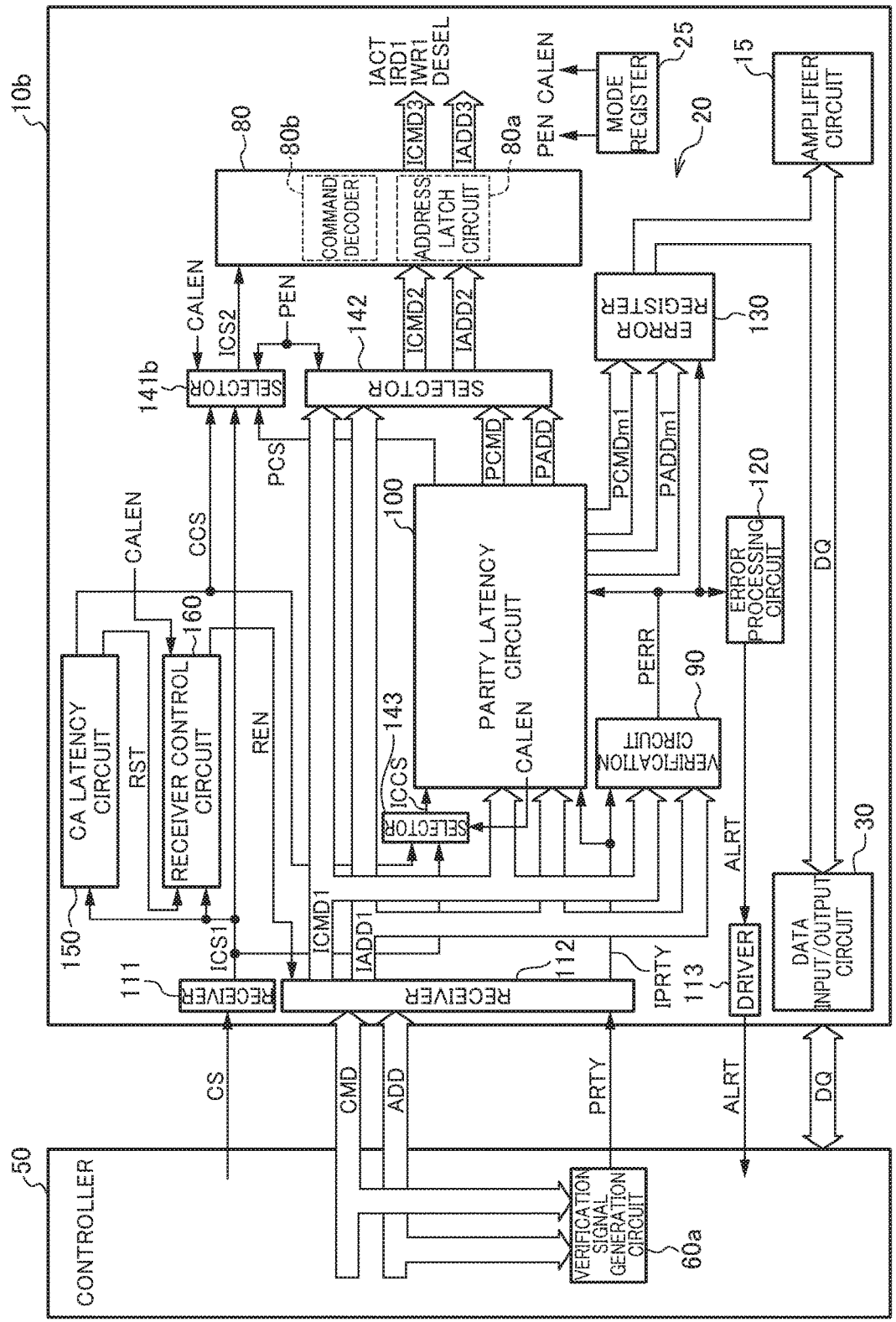
FIG. 7 is a block diagram indicative of an embodiment of a semiconductor device 10b according to a second preferred embodiment of the present invention and mainly shows details of circuit blocks belonging to the access control circuit 20 shown in FIG. 1.

Turning to FIG. 7, the same components as those shown in FIG. 3 will be designated by like reference numbers. Redundant description thereof will be omitted.

As shown in FIG. 7, according to the present embodiment, a CA latency circuit 150 and a receiver control circuit 160 are added to the access control circuit 20. The CA latency circuit 150 is a circuit that delays the internal chip select signal ICS1 by predetermined clock cycles and outputs the resultant as an internal chip select signal CCS. In the present embodiment, the CA latency circuit 150 may be referred to as a "fifth circuit". The internal chip select signal CCS is supplied to selectors 141b and 143. In the present embodiment, the selector 143 may be referred to as a "sixth circuit". The receiver control circuit 160 is a circuit that generates an enable signal REN based on the internal chip select signal ICS1 and a reset signal RST. The enable signal REN is supplied to the receiver 112 and controls the operation of the receiver 112.

Figure 8:
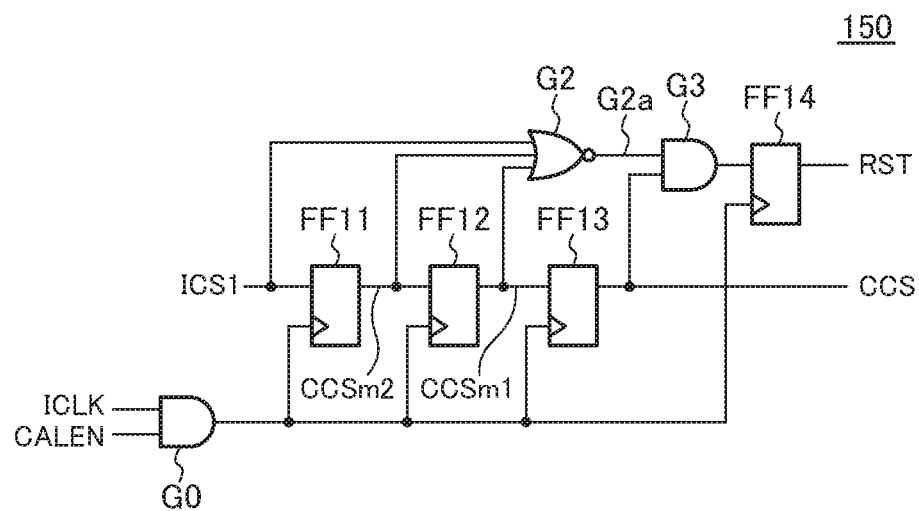
FIG. 8 is a circuit diagram of a CA latency circuit shown in FIG. 7.

Turning to FIG. 8, the CA latency circuit 150 has a latency of three clock cycles. The latency need not be fixed and may be variable depending on a mode setting. The mode setting is performed by setting a predetermined mode signal into the mode register 25 shown in FIG. 3. Set values of the mode register 25 include a set value about whether to enable or disable a CA latency operation. If an operation mode for enabling a CA latency operation (CALON mode) is set, a mode signal CALEN is activated to a high level, for example. If an operation mode for disabling a CA latency operation (CALOFF mode) is set, the mode signal CALEN is deactivated to a low level, for example.

The CA latency circuit 150 shown in FIG. 8 includes three stages of shift registers which are arranged on the path that receives the internal chip select signal ICS1 and outputs the internal chip select signal CCS. As a result, the internal chip select signal CCS is output after a lapse of three clock cycles since the reception of the internal chip select signal ICS1. The internal chip select signal ICS1, the output signal CCSm2 of the flip-flop circuit FF11 at the first stage, and the output signal CCSm1 of the flip-flop circuit FF12 at the second stage are supplied to a NOR gate circuit G2. The output signal G2a of the NOR gate circuit G2 and the output signal (internal chip select signal) CCS of the flip-flop circuit FF13 at the third stage are supplied to an AND gate circuit G3. The output of the AND gate circuit G3 is supplied to a flip-flop circuit FF14. With such a configuration, the reset signal RST is activated to a high level at the fourth clock cycle if the internal chip select signal ICS1 has not been activated to a high level for three clock cycles. The reset signal RST is supplied to the receiver control circuit 160.

The CA latency circuit 150 uses a shift clock that is generated by an AND gate circuit G0 ANDing the internal clock signal ICLK and the mode signal CALEN. The purpose for the use of such a shift clock is to stop the shift operation for reduced power consumption when the CALOFF mode is selected.

Figure 9:
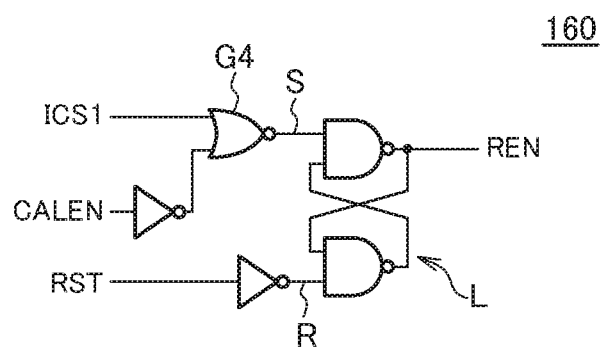
FIG. 9 is a circuit diagram indicative of an embodiment of a receiver control circuit shown in FIG. 7.

Turning to FIG. 9, the receiver control circuit 160 includes an SR latch circuit L. A NOR gate circuit G1 receives the inverted signal of the mode signal CALEN and the internal chip select signal ICS1. The output of the NOR gate circuit G4 is supplied to a set node S of the SR latch circuit L. The inverted signal of the reset signal RST is supplied to a reset node R of the SR latch circuit L. With such a configuration, if the mode signal CALEN is activated to a high level, i.e., set to the CALON mode and the internal chip select signal ICS1 is activated, then the enable signal REN is immediately activated to a high level. Subsequently, when the reset signal RST is activated, the enable signal REN is deactivated to a low level. The activation timing of the reset signal RST is as has been described with reference to FIG. 8. On the other hand, if the mode signal CALEN is deactivated to a low level, i.e., set to the CALOFF mode, the enable signal REN is constantly activated to a high level.

The enable signal REN is supplied to a receiver 112 shown in FIG. 7. The receiver 112 is activated in a period when the enable signal REN is at a high level, and deactivated when the enable signal REN is at a low level. In the meantime, the receiver 111 which receives the chip select signal CS is constantly activated.

As shown in FIG. 7, the internal chip select signal ICS1 and the internal chip select signal CCS passed through the CA latency control circuit 150 are supplied to the selector 143. The selector 143 selects either one of the internal chip select signals ICS1 and CCS based on the mode signal CALEN, and supplies the selected signal to the parity latency circuit 100 as an internal chip select signal ICCS. Specifically, if the mode signal CALEN is deactivated to a low level, i.e., set to the CALOFF mode, the selector 141 selects the internal chip select signal ICS1. If the mode signal CALEN is activated to a high level, i.e., set to the CALON mode, the selector 143 selects the internal chip select signal CCS.

The internal chip select signals ICS1, CCS, and PCS are supplied to the selector 141b. The selector 141b selects any one of the internal chip select signals ICS1, CCS, and PCS according to the truth table shown in FIG. 10, and outputs the selected signal to the circuit block 80 as an internal chip select signal ICS2.

The configuration of the semiconductor device 10b according to the second embodiment has been described so far. In other respects, the configuration of the semiconductor device 10b is basically the same as that of the semiconductor device 10a according to the first embodiment. Next, the operation of the semiconductor device 10b according to the present embodiment will be described.

FIGS. 11 to 14 are timing charts for explaining the operation of the semiconductor device 10b according to the present embodiment.

Figure 11:
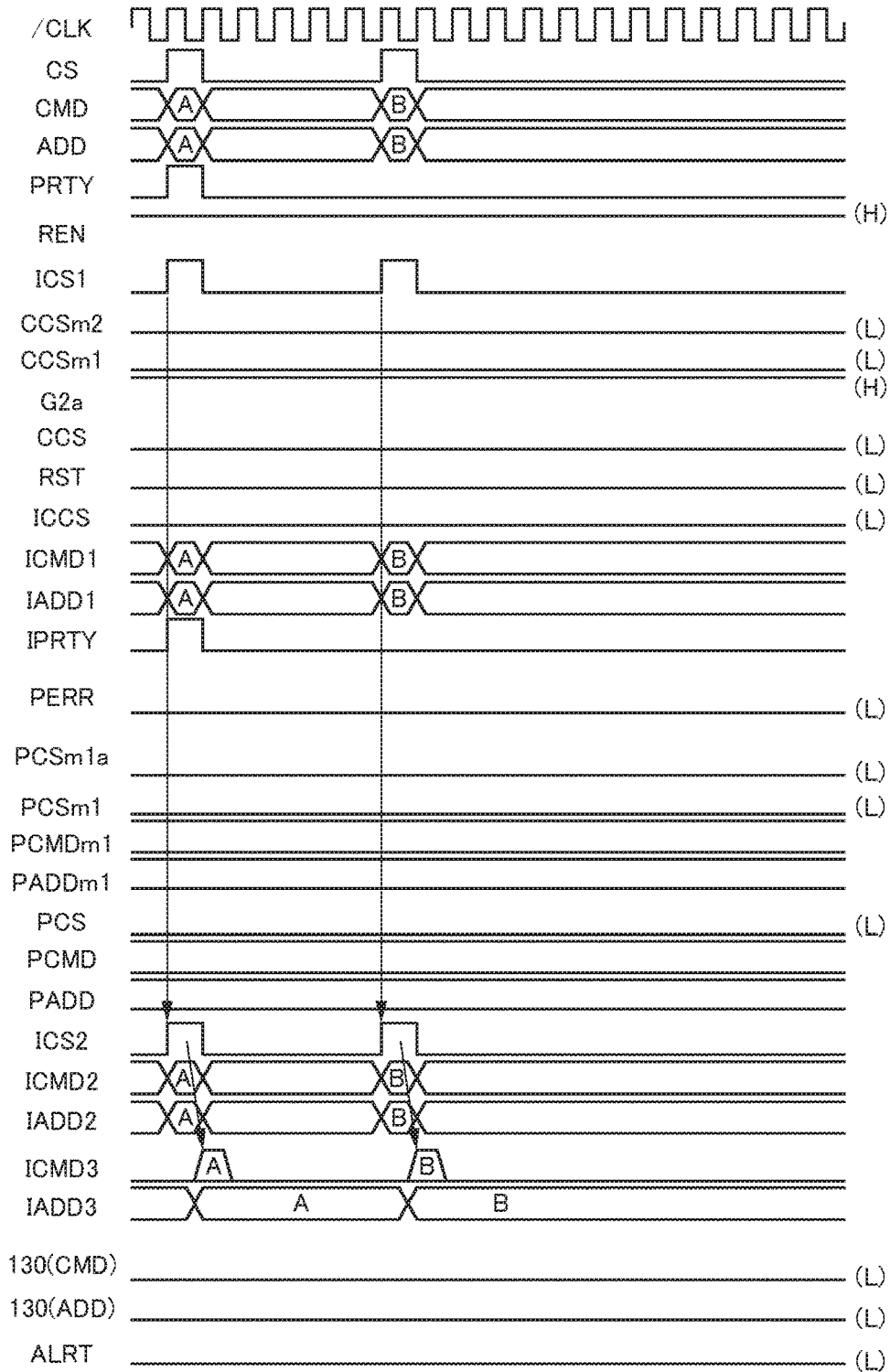
FIG. 11 is a timing chart for explaining the operation of the semiconductor device 10b according to the second embodiment and shows operations when the CALOFF mode and the parity OFF mode are set.

Turning to FIG. 11, when the CALOFF mode and the parity OFF mode are set, the operations are the same as those shown in FIG. 6A. More specifically, the controller 50 simultaneously issues the chip select signal CS, the command signal CMD, and the address signal ADD, based on which an operation is immediately performed. If the CALOFF mode is set, the SR latch circuit L included in the receiver control circuit 160 shown in FIG. 9 is always set to activate the receiver 112 all the time.

Figure 12:
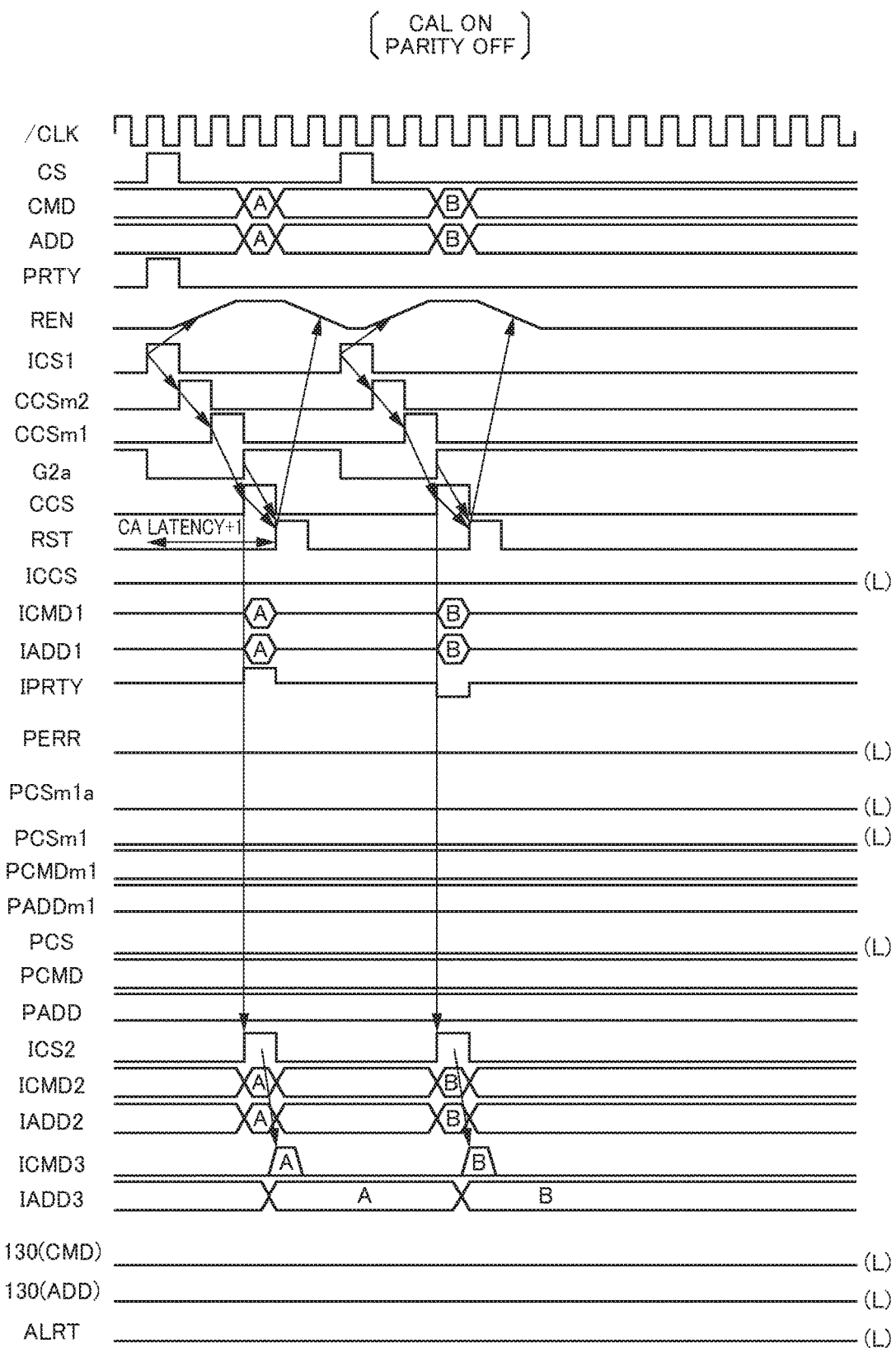
FIG. 12 is a timing chart for explaining the operation of the semiconductor device 10b according to the second embodiment and shows operations when the CALON mode and the parity OFF mode are set.

Turning to FIG. 12, when the CALON mode and the parity OFF mode are set, the timing of the issuance of the chip select signal CS from the controller 50 is not the same as that of the command signal CMD and the address signal ADD. The command signal CMD and the address signal ADD are issued after a lapse of the CAL latency since the issuance of the chip select signal CS. FIG. 12 shows a case where the CAL latency is set to three clock cycles.

As shown in FIG. 12, when the chip select signal CS is issued, the internal chip select signal ICS1 changes to a high level and thus the enable signal REN is activated to a high level. Consequently, the receiver 112 which has been deactivated are activated to allow the reception of the address signal ADD and the command signal CMD. It takes some time to change the first input stage of the receiver 112 from an inactive state to an active state. In FIG. 12, the gentle change of the enable signal REN represents the time needed.

The internal chip select signal ICS1 is passed through the flip-flop circuits FF11 to FF13 included in the CA latency circuit 150 and output as the internal chip select signal CCS three clock cycles later. The activation timing of the internal chip select signal CCS is in synchronization with the timing when the command signal CMD and the address signal ADD are issued from the controller 50. As a result, the command signal CMD and the address signal ADD are processed by the address latch circuit 80a and the command decoder 80b included in the circuit block 80.

After a lapse of a clock cycle since the activation of the internal chip select signal CCS, the reset signal RST is activated. This resets the SR latch circuit L included in the receiver control circuit 160, whereby the receiver 112 returns to an inactive state and the power consumption of the receiver 112 is reduced.

Figure 13:
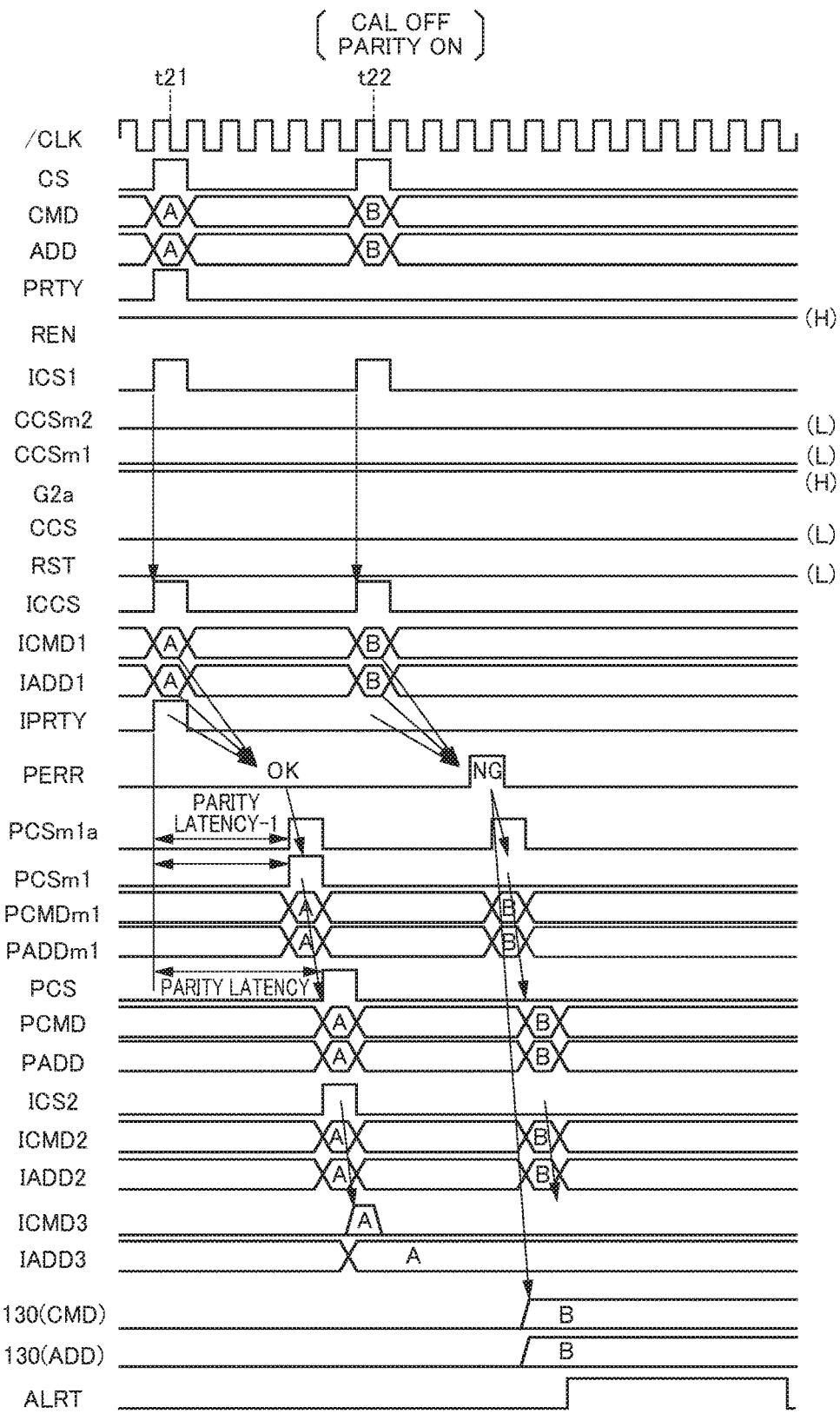
FIG. 13 is a timing chart for explaining the operation of the semiconductor device 10b according to the second embodiment and shows operations when the CALOFF mode and the parity ON mode are set.

Turning to FIG. 13, when the CALOFF mode and the parity ON mode are set, the operations are the same as those shown in FIG. 6B. In the example shown in FIG. 13, the chip select signal CS, the command signal CMD, and the address signal ADD are issued at times t21 and t22.

Suppose that the command signal CMD and the address signal ADD supplied at times t21 and t22 include an odd number of high-level bits and an even number of high-level bits, respectively. The total numbers of high-level bits are odd numbers, and the corresponding correct verification signal PRTY is at a high level. The verification signal PRTY supplied for the command signal CMD and the address signal ADD issued at time t21 is correctly at a high level. On the other hand, the verification signal PRTY supplied for the command signal CMD and the address signal ADD issued at time t22 is at a low level. In response to this, the verification circuit 90 activates the parity error signal PERR to a high level. The activation of the parity error signal PERR deactivates the internal chip select signal PCS to a low level, which results in the same state as when a DESEL command is issued. The command signal CMD and the address signal ADD issued at time t22 are taken into the error register 130. The alert signal ALRT occurs.

Figure 14:
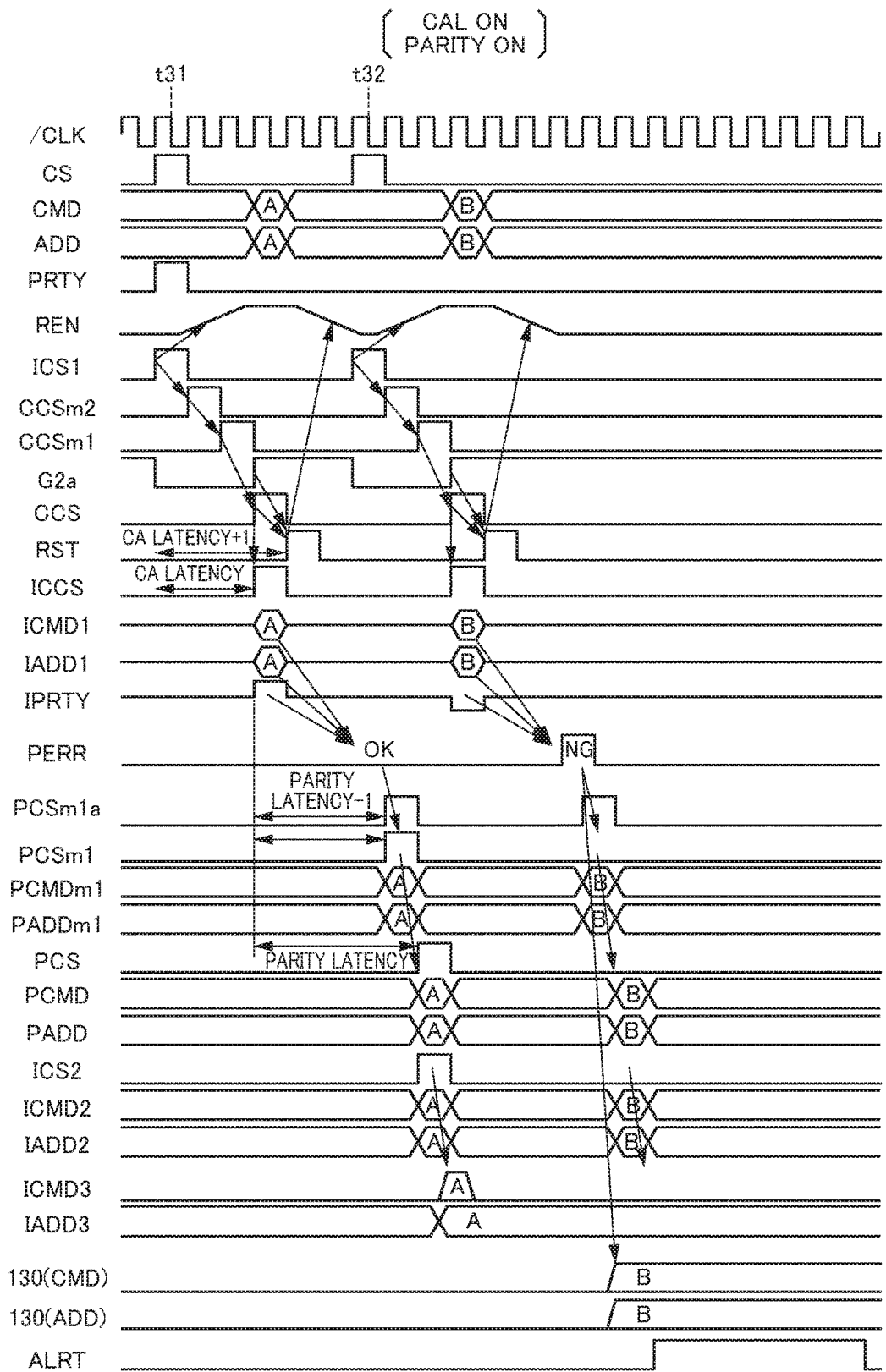
FIG. 14 is a timing chart for explaining the operation of the semiconductor device 10b according to the second embodiment and shows operations when the CALON mode and the parity ON mode are set.

Turning to FIG. 14, when the CALON mode and the parity ON mode are set, the operations shown in FIGS. 12 and 13 are combined. More specifically, the command signal CMD and the address signal ADD are issued after a lapse of the CAL latency since the issuance of the chip select signal CS. The issued command signal CMD and address signal ADD are subjected to a parity check. In the example shown in FIG. 14, the chip select signal CS is issued at times t31 and t32. The corresponding command signal CMD and address signal ADD are issued after a lapse of three clock cycles since times t31 and t32.

Like the example shown in FIG. 13, the command signal CMD and the address signal ADD supplied after a lapse of three clock cycles since times t31 and t32 include an odd number of high-level bits and an even number of high-level bits, respectively. The total numbers of high-level bits are odd numbers, and the corresponding correct verification signal PRTY is at a high level. However, the verification signal PRTY supplied after a lapse of three clock cycles since time t32 is at a low level, so that the verification circuit 90 activates the parity error signal PERR to a high level. The command signal CMD and the address signal ADD are taken into the error register 130. The alert signal ALRT occurs.

As described above, the semiconductor device 10b according to the present embodiment has the CALON mode. In addition to the effects of the semiconductor device 10a according to the first embodiment, it is therefore possible to activate the receiver 112 at the issuance timing of the address signal ADD and the command signal CMD. In other words, the receiver 112 can be put into an inactivate state for reduced power consumption at timing when the address signal ADD and the command signal CMD are not issued.

Next, a third embodiment of the present invention will be described.

Figure 15:
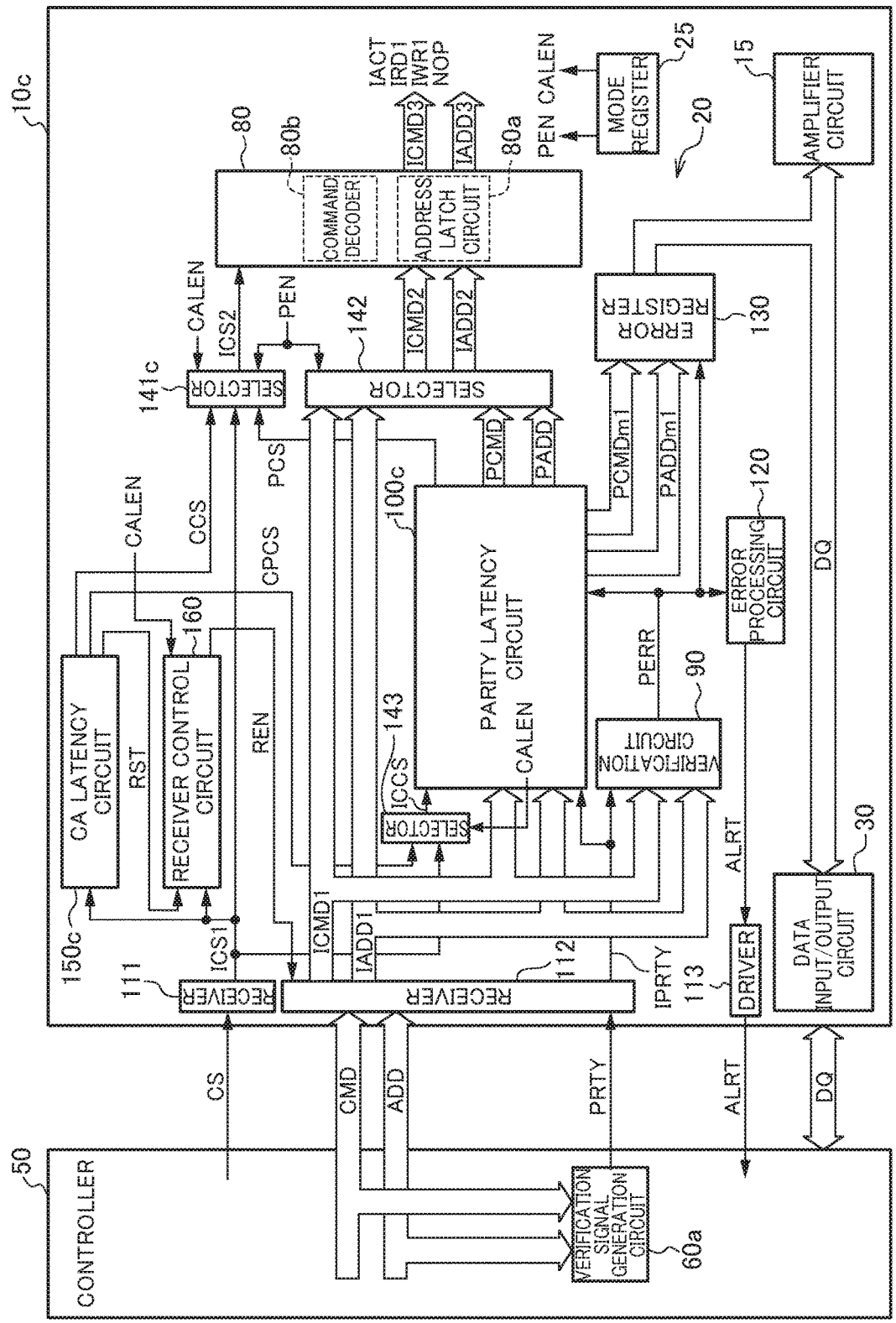
FIG. 15 is a block diagram indicative of an embodiment of a semiconductor device 10c according to a third preferred embodiment of the present invention and mainly shows details of circuit blocks belonging to the access control circuit 20 shown in FIG. 1.

Turning to FIG. 15, according to the present embodiment, the parity latency circuit 100, the CA latency circuit 150, and the selector 141b shown in FIG. 7 are replaced with a parity latency circuit 100c, a CA latency circuit 150c, and a selector 141c, respectively. In other respects, the present embodiment is the same as the semiconductor device 10b shown in FIG. 7. The same components will thus be designated by like reference numerals. Redundant description will be omitted.

Figure 16:
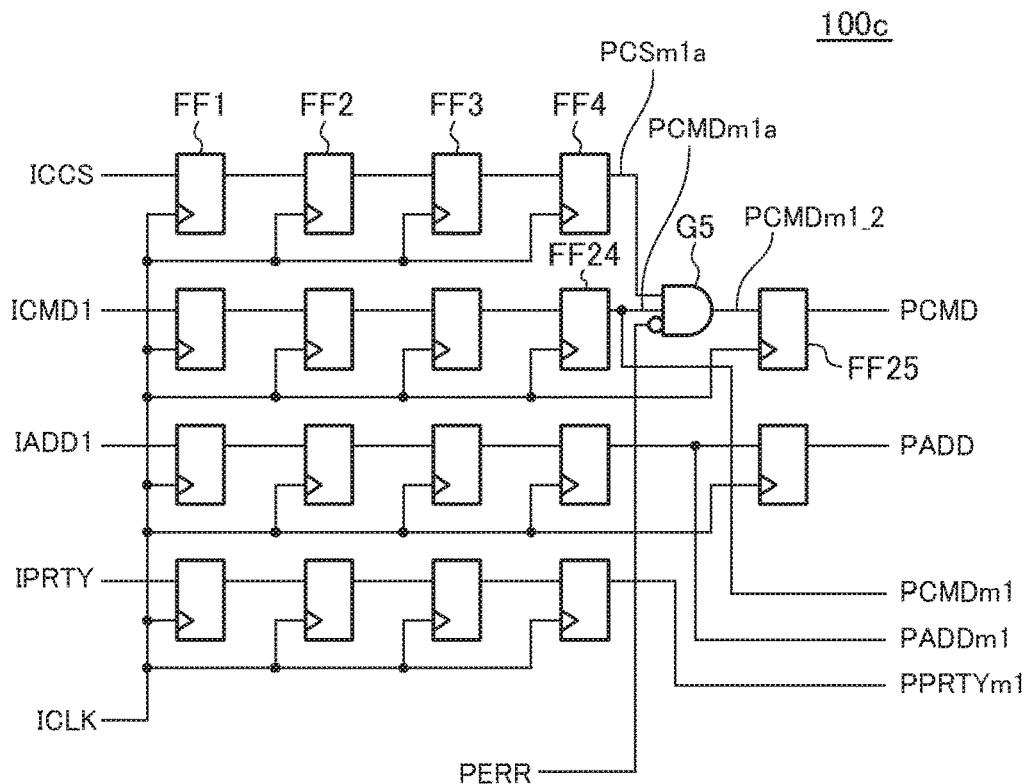
FIG. 16 is a circuit diagram indicative of an embodiment of a parity latency circuit shown in FIG. 16.

Turning to FIG. 16, the parity latency circuit 100c is configured so that the flip-flop circuit FF5 and the AND gate circuit G1 included in the parity latency circuit 100 shown in FIG. 5 are eliminated. Instead, a logic gate circuit G5 is inserted between flop-flop circuits FF24 and FF25. In FIG. 16, the logic gate circuit G5 is represented by the symbol mark of an AND gate circuit. Such a representation corresponds to the fact that the command signal CMD, as will be described later, is handled as a NOP command if all the bits (ACT, RAS, CAS, and WE) constituting the command signal CMD are at a low level.

The logic gate circuit G5 is a circuit that receives the output signals of the flip-flop circuits FF4 and FF24 and the parity error signal PERR. The logic gate circuit G5 logically synthesizes the signals into a signal PCMDm1_2 (synthesis signal) and outputs the signal PCMDm1_2 to the flip-flop circuit FF25. If the output of the flip-flop circuit FF4, i.e., the internal chip select signal PCSm1a is at a high level and the parity error signal PERR is at a low level, the logic gate circuit G5 simply supplies an internal command signal PCMDm1a output from the flip-flop circuit FF24 to the flip-flop circuit FF25. In other words, if the semiconductor device 10c is selected and there is no parity error, the internal command signal is allowed to pass.

On the other hand, if the internal chip select signal PCSm1a is at a low level or the parity error signal PERR is at a high level, the logic gate circuit G5 supplies a NOP command to the flip-flop circuit FF25 regardless of the content of the internal command signal PCMDm1a output from the flip-flop circuit FF24. In other words, if the semiconductor device 10c is not selected or there is a parity error, the internal command signal is forcefully converted into a NOP command.

Figure 17:
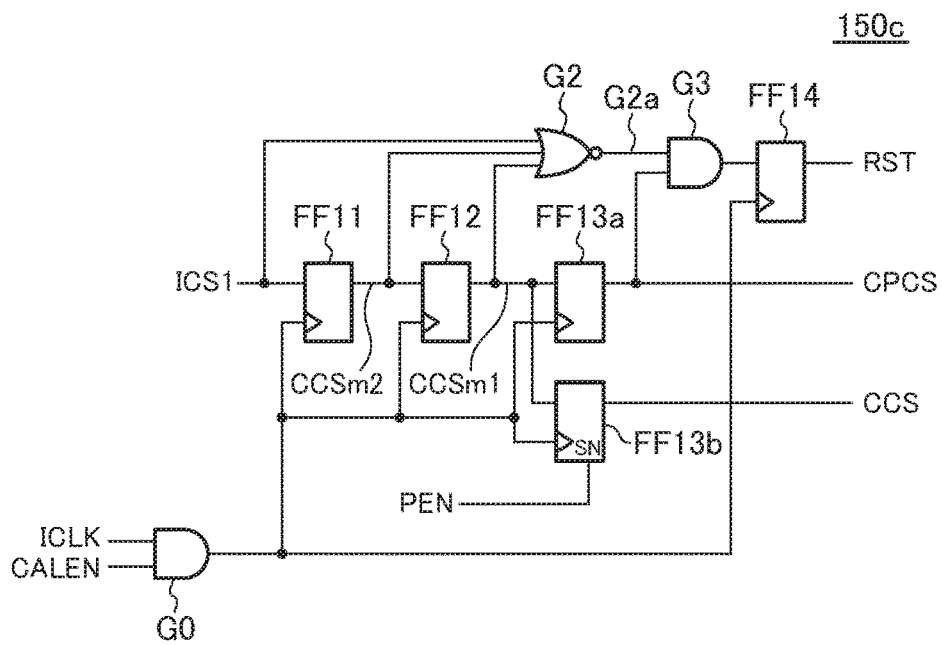
FIG. 17 is a circuit diagram indicative of an embodiment of a CA latency circuit shown in FIG. 16.

Turning to FIG. 17, the CA latency circuit 150c includes two flip-flop circuits FF13a and FF13b connected in parallel instead of the flip-flop circuit FF13 which is included in the CA latency circuit 150 shown in FIG. 9. The output of the flip-flop circuit FF13a is used as an internal chip select signal CPCS. The output of the flip-flop circuit FF13b is used as the internal chip select signal CCS. The flip-flop circuit FF13b has a set node SN to which the mode signal PEN is input. If the mode signal PEN is at a high level (parity ON mode), the internal chip select signal CCS is thus fixed to a high level. As shown in FIG. 15, the internal chip select signal CCS is supplied to the selector 141c. The internal chip select signal CPCS is supplied to the selector 143.

The selector 141c selects either one of the internal chip select signals ICS1 and CCS according to the truth table shown in FIG. 18, and outputs the selected signal to the circuit block 80 as the internal chip select signal ICS2.

In the present embodiment, the internal command signal ICMD3 output from the circuit block 80 includes an internal command INOP which is intended to maintain the state of the memory cell array. The internal command INOP is generated when the internal command signal ICMD2 indicates a NOP command.

The configuration of the semiconductor device 10c according to the third embodiment has been described so far. In other respects, the configuration of the semiconductor device 10c is basically the same as that of the semiconductor device 10b according to the second embodiment. Next, the operation of the semiconductor device 10c according to the present embodiment will be described.

FIGS. 19 to 22 are timing charts for explaining the operation of the semiconductor device 10c according to the present embodiment.

Figure 19:
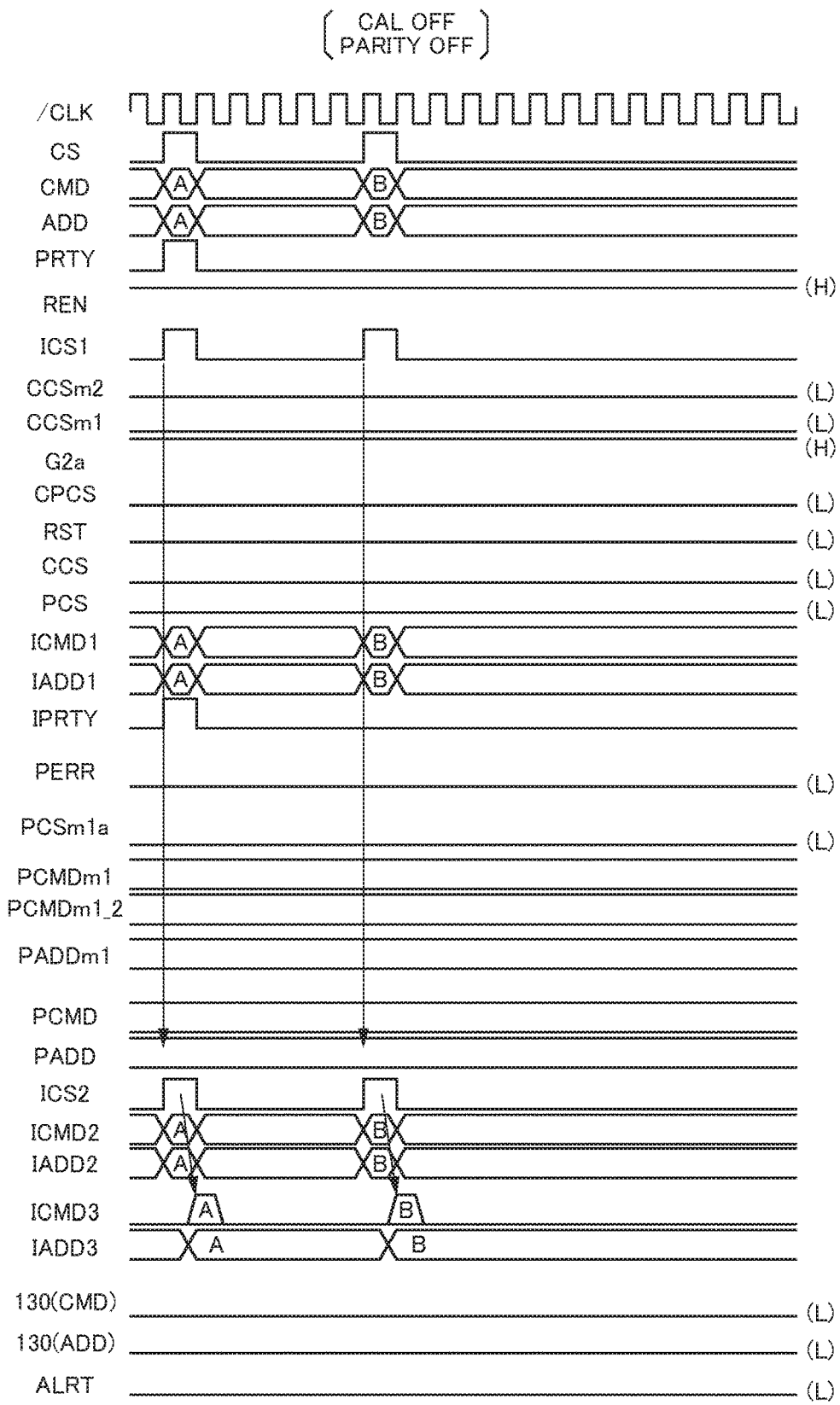
FIG. 19 is a timing chart for explaining the operation of the semiconductor device 10c according to the third embodiment and shows operations when the CALOFF mode and the parity OFF mode are set.

Turning to FIG. 19, when the CALOFF mode and the parity OFF mode are set, the operations are basically the same as those shown in FIG. 11. More specifically, the controller 50 simultaneously issues the chip select signal CS, the command signal CMD, and the address signal ADD, based on which an operation is immediately performed. When the CALOFF mode is set, the enable signal REN is fixed to a high level and the receiver 112 is activated all the time.

Figure 20:
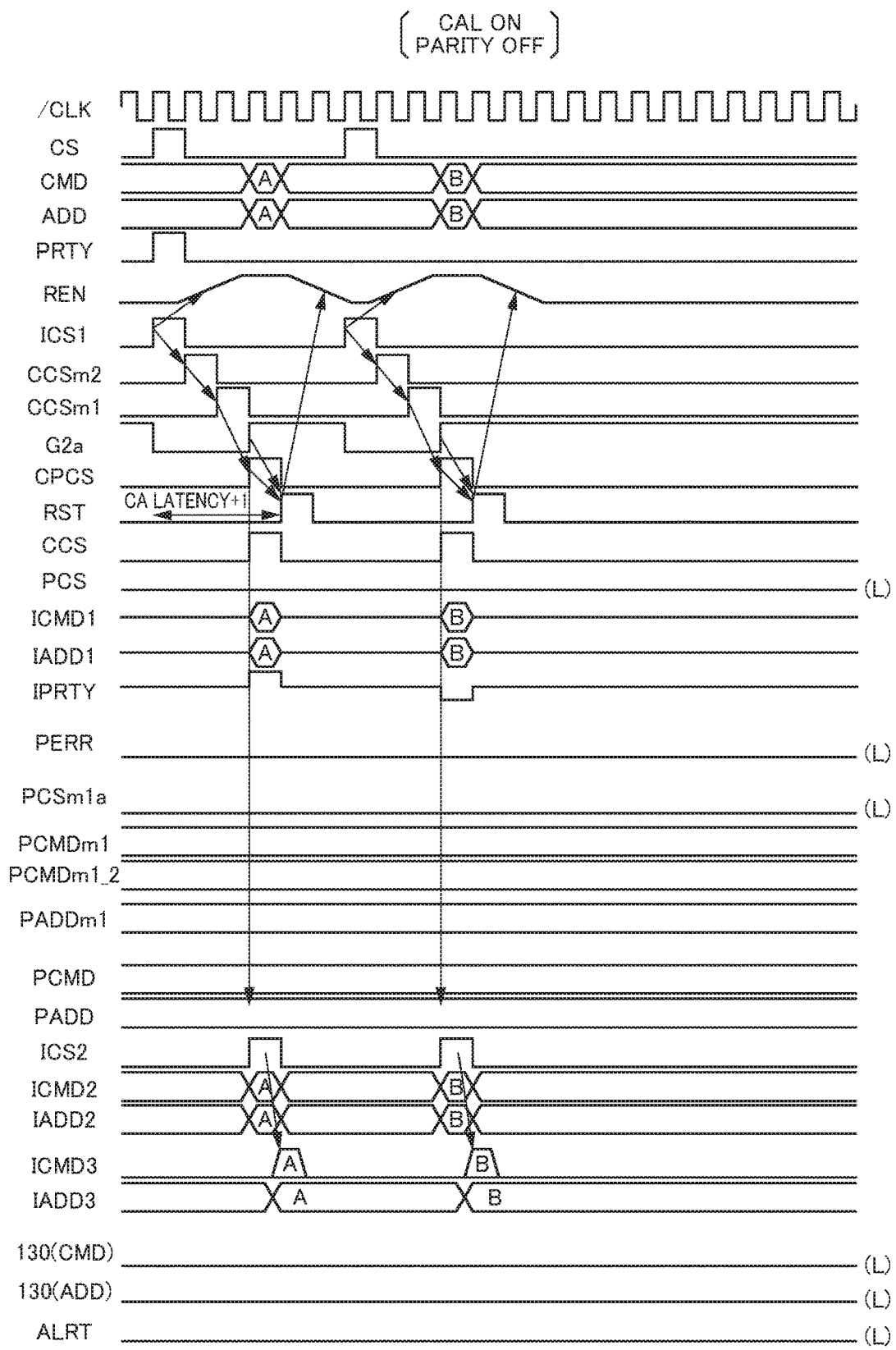
FIG. 20 is a timing chart for explaining the operation of the semiconductor device 10c according to the third embodiment and shows operations when the CALON mode and the parity OFF mode are set.

Turning to FIG. 20, when the CALON mode and the parity OFF mode are set, the operations are basically the same as those shown in FIG. 12. More specifically, the command signal CMD and the address signal ADD are issued after a lapse of the CAL latency since the issuance of the chip select signal CS. In response to the activation of the chip select signal CS, the enable signal REN changes to a high level, whereby the receiver 112 which has been deactivated is activated. The command signal CMD and the address signal ADD are subsequently issued after a lapse of the CAL latency, and the receiver 112 can properly receive the signals.

Figure 21:
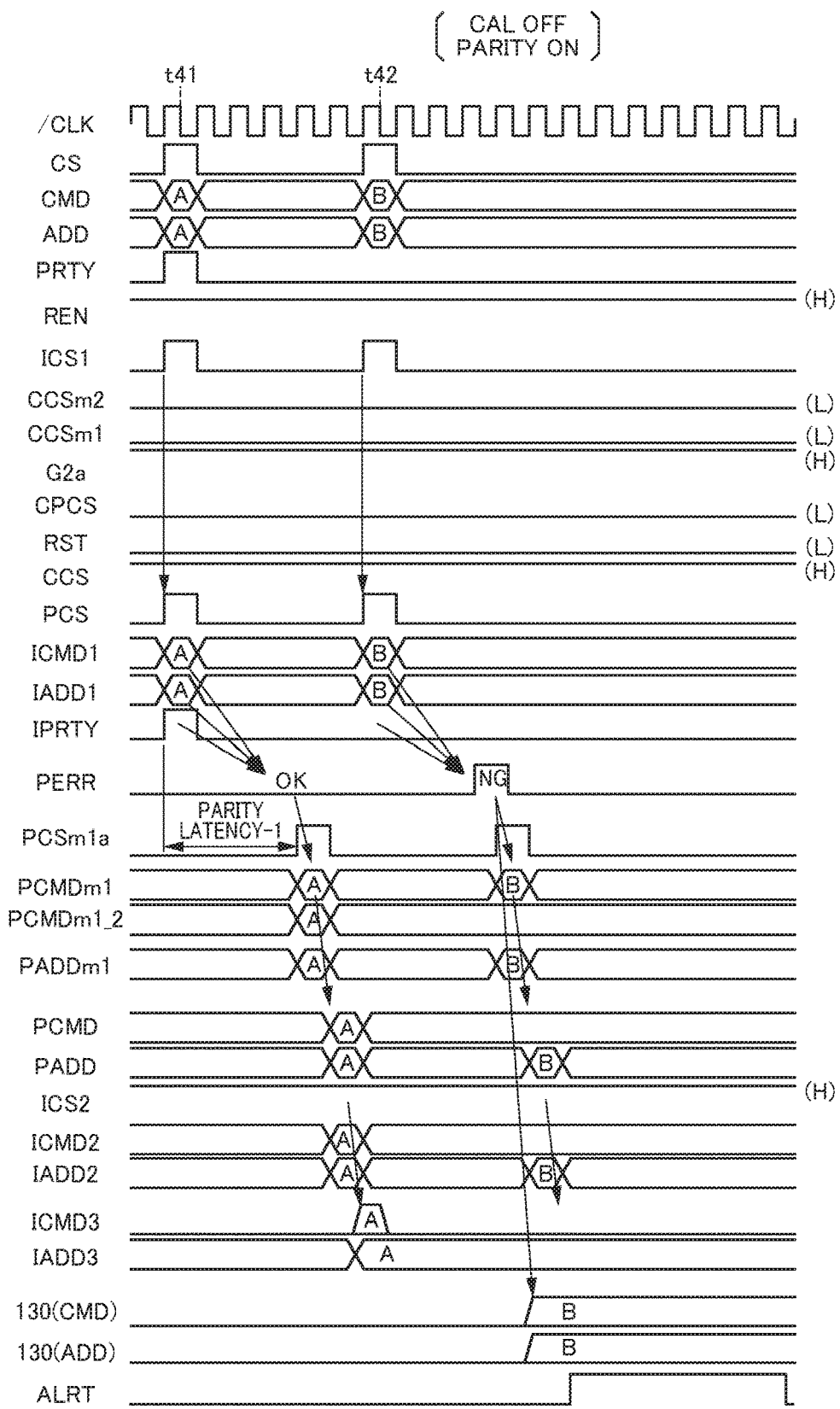
FIG. 21 is a timing chart for explaining the operation of the semiconductor device 10c according to the third embodiment and shows operations when the CALOFF mode and the parity ON mode are set.

Turning to FIG. 21, when the CALOFF mode and the parity ON mode are set, a parity check is performed. Suppose that the command signal CMD and the address signal ADD supplied at times t41 and t42 includes an odd number of high-level bits and an even number of high-level bits, respectively. The total numbers of high-level bits are odd numbers, and the corresponding correct verification signal PRTY is at a high level. The verification signal PRTY supplied for the command signal CMD and the address signal ADD issued at time t41 is correctly at a high level. On the other hand, the verification signal PRTY supplied for the command signal CMD and the address signal ADD issued at time t42 is at a low level. In response to this, the verification circuit 90 activates the parity error signal PERR to a high level.

When the parity error signal PERR is at a high level, the logic gate circuit G5 shown in FIG. 16 outputs a NOP command regardless of the input command. The command signal CMD issued at time t42 is thus converted into a NOP command by the parity latency circuit 100c. The NOP command is supplied to the command decoder 80b. Consequently, the internal circuits such as the row decoder 12 and the column decoder 13 maintain their current state. The command signal CMD and the address signal ADD are taken into the error register 130. The alert signal ALRT occurs.

Figure 22:
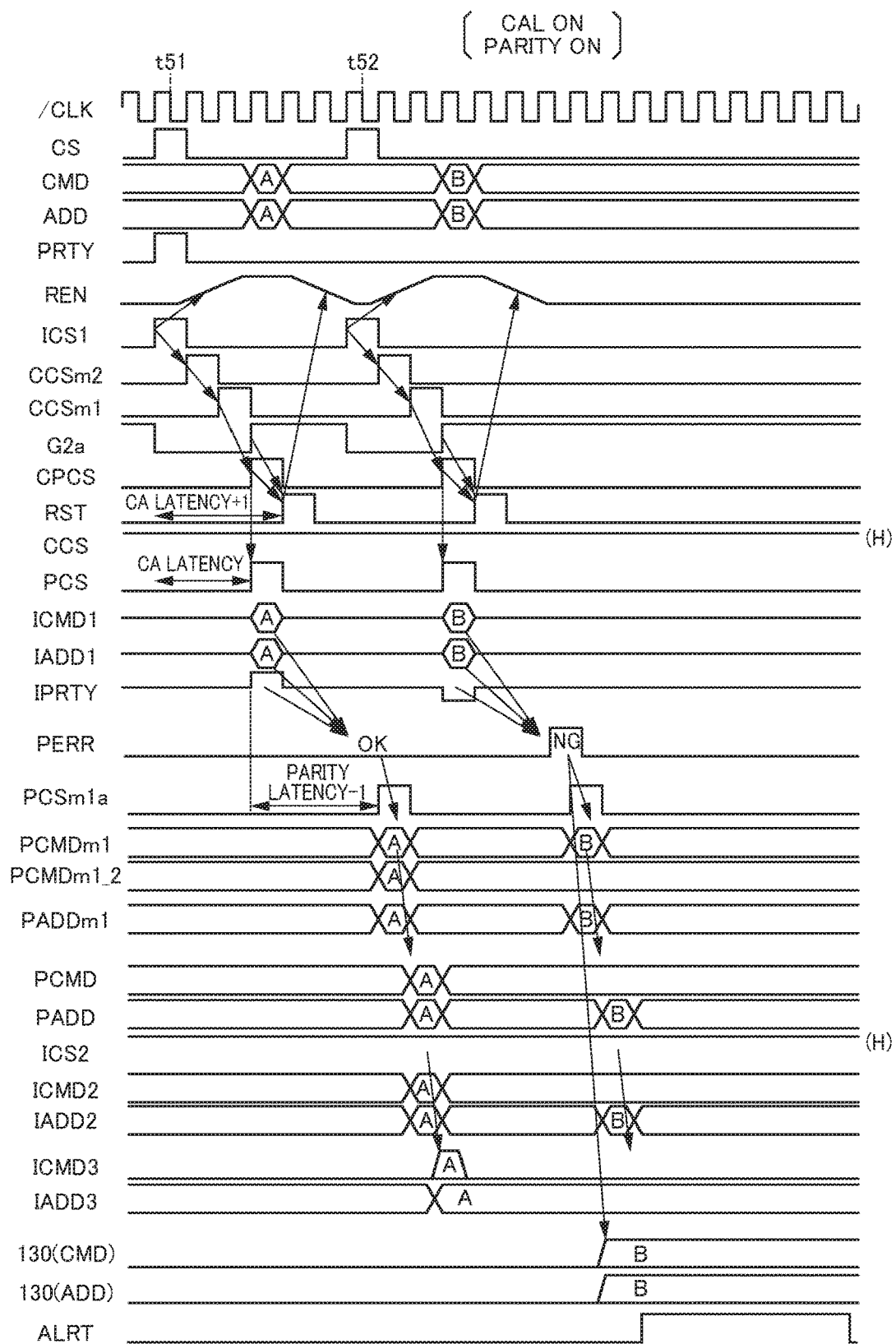
FIG. 22 is a timing chart for explaining the operation of the semiconductor device 10c according to the third embodiment and shows operations when the CALON mode and the parity ON mode are set.

Turning to FIG. 22, when the CALON mode and the parity ON mode are set, the operations shown in FIGS. 20 and 21 are combined. More specifically, the command signal CMD and the address signal ADD are issued after a lapse of the CAL latency since the issuance of the chip select signal CS. The issued command signal CMD and address signal ADD are subjected to a parity check. In the example shown in FIG. 22, the chip select signal CS is issued at times t51 and t52. The corresponding command signal CMD and address signal ADD are issued after a lapse of three clock cycles since times t51 and t52.

Like the example shown in FIG. 22, the command signal CMD and the address signal ADD supplied after a lapse of three clock cycles since times t51 and t52 include an odd number of high-level bits and an even number of high-level bits, respectively. The total numbers of high-level bits are odd numbers, and the corresponding correct verification signal PRTY is at a high level. The verification signal PRTY supplied after a lapse of three clock cycles since time t52 is at a low level, so that the verification circuit 90 activates the parity error signal PERR to a high level. As a result, the command signal CMD that is issued after a lapse of three clock cycles since time t52 is converted into a NOP command. The command signal CMD and the address signal ADD are taken into the error register 130. The alert signal ALRT occurs.

As described above, the semiconductor device 10c according to the present embodiment converts an issued command into a NOP command if there occurs a parity error. The internal circuits such as the row decoder 12 and the column decoder 13 are therefore prevented from making an operation based on an erroneous address signal ADD or an erroneous command signal CMD.

Next, a fourth embodiment of the present invention will be described.

Figure 23:
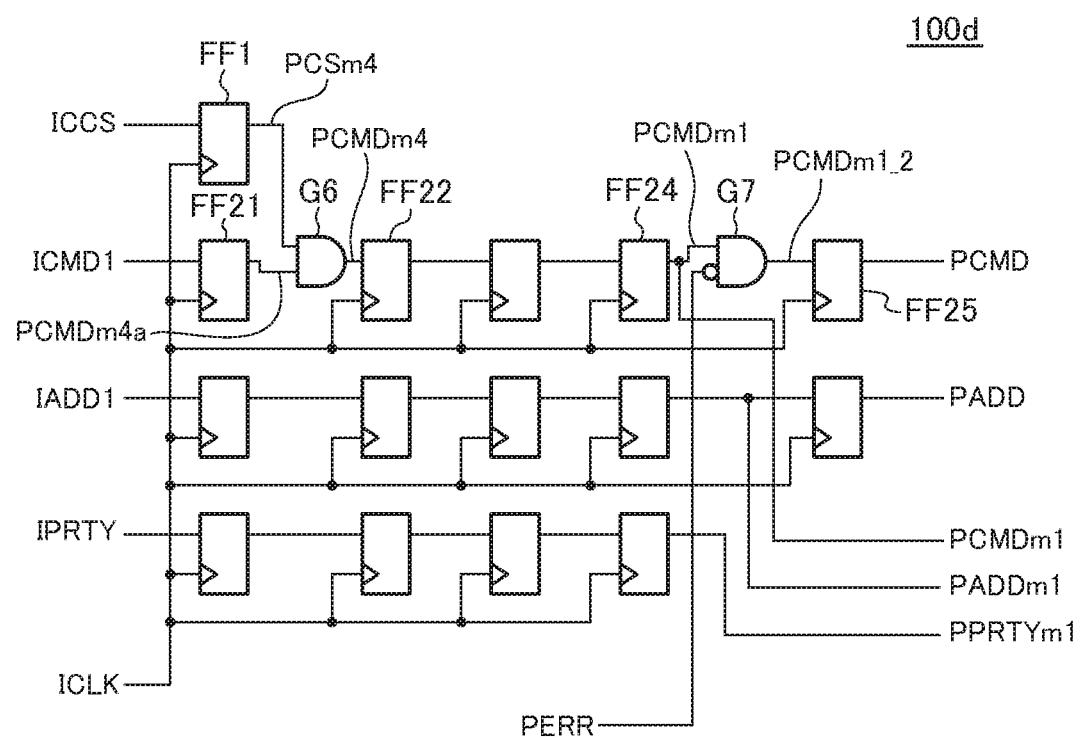
FIG. 23 is a circuit diagram indicative of an embodiment of a parity latency circuit 100d used in a fourth embodiment of the present invention.

Turning to FIG. 23, the parity latency circuit 100d used in the present embodiment is configured so that the flip-flop circuits FF2 to FF4 included in the parity latency circuit 100c shown in FIG. 16 are eliminated. Instead, a logic gate circuit G6 is inserted between the flip-flop circuits FF21 and FF22. In FIG. 23, the logic gate circuit G6 is represented by the symbol mark of an AND gate circuit. The reason is the same as why the foregoing logic gate circuit G5 is represented by the symbol mark of an AND gate circuit.

The logic gate circuit G6 is a circuit that receives the output signal PCSm4 of the flip-flop circuit FF1 and the output signal PCMDm4a of the flip-flop circuit FF21. The logic gate circuit G6 logically synthesizes the signals into a signal PCMDm4 (first synthesis signal) and outputs the first synthesis signal PCMDm4 to the flip-flop circuit FF22. If the output of the flip-flop circuit FF1, i.e., the internal chip select signal PCSm4 is at a high level, the logic gate circuit G6 simply supplies the internal command signal PCMDm4a output from the flip-flop circuit FF21 to the flip-flop circuit FF22. On the other hand, if the internal chip select signal PCSm4 is at a low level, the logic gate circuit G6 supplies a NOP command to the flip-flop circuit FF22 regardless of the content of the internal command signal PCMDm4a output from the flip-flop circuit FF21.

A logic gate circuit G7 is inserted between the flip-flop circuits FF24 and FF25 instead of the logic gate circuit G5. In FIG. 23, the logic gate circuit G7 is represented by the symbol mark of an AND gate circuit for the same reason as the foregoing.

The logic gate circuit G7 is a circuit that receives the output signal PCMDm1 of the flip-flop circuit FF24 and the parity error signal PERR. The logic gate circuit G7 logically synthesizes the signals into a signal PCMDm1_2 (second synthesis signal) and outputs the second synthesis signal PCMDm1_2 to the flip-flop circuit FF25. If the parity error signal PERR is at a low level, i.e., there is no parity error, the logic gate circuit G7 simply supplies the internal command signal PCMDm1 output from the flip-flop circuit FF24 to the flip-flop circuit FF25. On the other hand, if the parity error signal PERR is at a high level, i.e., there occurs a parity error, the logic gate circuit G7 supplies a NOP command to the flip-flop circuit FF25 regardless of the content of the internal command signal PCMDm1 output from the flip-flop circuit FF24.

As described above, according to the present embodiment, if the internal chip select signal ICCS is at a low level, i.e., the semiconductor device is in an unselected state, the internal command signal is converted into a NOP command at an earlier stage. This can reduce the number of stages of flip-flop circuits that shift the internal chip select signal. Consequently, the circuit scale can be reduced with a further reduction in power consumption.

It is apparent that the present invention is not limited to the above embodiments, but may be modified and changed without departing from the scope and spirit of the invention.

For example, the foregoing embodiments have dealt with the cases of verifying the entire logic of the command signal CMD and the address signal ADD. However, the present invention is not limited thereto. The logic of only the command signal CMD may be verified. The logic of only the address signal ADD may be verified.

Volatile memories, non-volatile memories, or mixtures of them can be applied to the memory cells of the present invention.

The technical concept of the present invention is not limited to a semiconductor device including memory cells, and may be applied to a semiconductor device including a signal transmission circuit. The forms of the circuits in the circuit blocks disclosed in the drawings and other circuits for generating the control signals are not limited to the circuit forms disclosed in the embodiments.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors that constitute a logic gate and the like are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following devices and information processing systems:

A1. A semiconductor device comprising:
a memory cell array that includes a plurality of memory cells; and
an access control circuit that receives an address signal indicating an address of at least one of the memory cells to be accessed and a command signal indicating an access type, and accessing the memory cell array based on the address signal and the command signal, wherein
the access control circuit includes a verification circuit that verifies the address signal and the command signal based on a verification signal supplied from outside, and
the verification circuit stops accessing the memory cell array indicated by the command signal when the address signal or the command signal is determined to be erroneous.

A2. The semiconductor device as described in A1, wherein the verification circuit converts the access type indicated by the command signal into a different access type when the address signal or the command signal is determined to be erroneous.

A3. The semiconductor device as described in A2, wherein the access control circuit is activated when a chip select signal supplied from outside is in a first logic level, and deactivated when the chip select signal is in a second logic level.

A4. The semiconductor device as described in A1 or A3, wherein when the address signal or the command signal is determined to be erroneous, the verification circuit changes the chip select signal in the first logic level supplied from outside into the second logic level, thereby converting the access type indicated by the command signal into a different access type.

A5. The semiconductor device as described in A1 or A3, wherein when the address signal or the command signal is determined to be erroneous, the verification circuit changes the access type indicated by the command signal supplied from outside into a NOP command for making no access to the memory cell array.

A6. The semiconductor device as described in A3 or A4, wherein
the access control circuit further includes a latency circuit that delays the chip select signal by a predetermined period, and
the verification circuit verifies the address signal and the command signal output from outside the predetermined period after the chip select signal is supplied from outside.

A7. An information processing system comprising:
a semiconductor device that includes a memory cell array including a plurality of memory cells; and
a controller that controls the semiconductor device, wherein
the controller includes an output circuit that supplies an address signal indicating an address of at least one of a memory cells to be accessed, a command signal indicating an access type, and a verification signal generated based on the address signal and the command signal to the semiconductor device,
the semiconductor device includes an access control circuit that accessing the memory cell array based on the address signal and the command signal,
the access control circuit includes a verification circuit that verifies the address signal and the command signal based on the verification signal, and the verification circuit stops accessing the memory cell array indicated by the command signal when the address signal or the command signal is determined to be erroneous.

A8. The information processing system as described in A7, wherein the verification circuit converts the access type indicated by the command signal into a different access type when the address signal or the command signal is determined to be erroneous.

A9. The information processing system as described in A8, wherein the output circuit further supplies a chip select signal to the semiconductor device, and the access control circuit is activated when the chip select signal is in a first logic level, and deactivated when the chip select signal is in a second logic level.

A10. The information processing system as described in A7 or A9, wherein when the address signal or the command signal is determined to be erroneous, the verification circuit changes the chip select signal in the first logic level supplied from the controller into the second logic level, thereby converting the access type indicated by the command signal into a different access type.

A11. The information processing system as described in A7 or A9, wherein when the address signal or the command signal is determined to be erroneous, the verification circuit changes the access type indicated by the command signal supplied from the controller into a NOP command for making no access to the memory cell array.

A12. The information processing system as described in A9 or A10, wherein the output circuit outputs the address signal and the command signal a predetermined period after outputting the chip select signal, the access control circuit further includes a latency circuit that delays the chip select signal by the predetermined period, and the verification circuit verifies the address signal and the command signal output from the controller the predetermined period after the chip select signal is supplied from the controller.

What is claimed is:

1. A method for controlling a memory device comprising:
    supplying a clock signal to a clock terminal of the memory device;
    supplying a chip select signal a chip select terminal to the memory device;
    supplying a first selected one of an address signal and a command signal to a first plurality of terminals of the memory device, a first predetermined latency occurring after supplying the chip select signal, wherein the first predetermined latency is an integer number of periods of the dock signal and the memory device retains the chip select signal for the first predetermined latency and the first selected one of an address signal and a command signal in a register; and
    receiving the contents of the register from data terminals of the memory device after said latency.

2. The method for controlling a memory device as claimed in claim 1, further comprising supplying a second selected one of an address signal and a command signal to a second plurality of terminals of the memory device, a first predetermined latency occurring after supplying the chip select signal, wherein the memory device retains the chip select signal for the first predetermined latency and the second selected one of an address signal and a command signal in the register.

3. The method for controlling a memory device as claimed in claim 1, further comprising supplying a mode setting signal to the memory device to set the value of the first predetermined latency.

4. The method for controlling a memory device as claimed in claim 1, wherein the first predetermined latency is 5 periods of the clock signal.

5. The method for controlling a memory device as claimed in claim 1, wherein the memory device retains the first selected one of an address signal and a command signal in the register if an error is detected in the first selected one of an address signal and a command signal.

6. The method for controlling a memory device as claimed in claim 1, further comprising supplying a parity signal to a parity terminal of the memory device, wherein the parity signal is determined from the first selected one of an address signal and a command signal.

7. The method for controlling a memory device as claimed in claim 6, wherein the memory device compares the parity signal with the first selected one of an address signal and a command signal to detect whether there is an error in the first selected one of an address signal and a command signal.

8. The method for controlling a memory device as claimed in claim 7, wherein the memory device does not access a memory array if an error in the first selected one of an address signal and a command signal is detected.

9. The method for controlling a memory device as claimed in claim 7, further comprising receiving an alert signal from the memory device indicating an error in the first selected one of an address signal and a command signal.

10. The method for controlling a memory device as claimed in claim 7, further comprising supplying a mode setting signal to the memory device to enable the comparison of the parity signal with the first selected one of an address signal and a command signal.

* * * * *